US012400925B1

United States Patent
Park

(10) Patent No.: US 12,400,925 B1
(45) Date of Patent: Aug. 26, 2025

(54) FIELD EFFECT TRANSISTOR INCLUDING TRANSITION METAL DICHALCOGENIDE COVERED WITH PROTECTIVE LAYER, AND METHOD OF MANUFACTURING THE SAME

(71) Applicant: INDUSTRY-ACADEMIC COOPERATION FOUNDATION GYEONGSANG NATIONAL UNIVERSITY, Jinju-si (KR)

(72) Inventor: Jun Hong Park, Jinju-si (KR)

(73) Assignee: INDUSTRY-ACADEMIC COOPERATION FOUNDATION GYEONGSANG NATIONAL UNIVERSITY, Jinju-si (KR)

( * ) Notice: Subject to any disclaimer, the term of this patent is extended or adjusted under 35 U.S.C. 154(b) by 0 days.

(21) Appl. No.: 19/097,611

(22) Filed: Apr. 1, 2025

(30) Foreign Application Priority Data

Apr. 15, 2024 (KR) .......................... 10-2024-0050234

(51) Int. Cl.
*H01L 21/00* (2006.01)
*H01L 21/56* (2006.01)
(Continued)

(52) U.S. Cl.
CPC .......... *H01L 23/293* (2013.01); *H01L 21/568* (2013.01); *H01L 23/564* (2013.01); *H10D 30/017* (2025.01); *H10D 30/481* (2025.01)

(58) Field of Classification Search
None
See application file for complete search history.

(56) References Cited

U.S. PATENT DOCUMENTS 7,242,041 B2 * 7/2007 Bucher .................. H10D 62/80
257/353
2007/0173066 A1 * 7/2007 Kokura ............. H01L 21/31138
438/715
(Continued)

FOREIGN PATENT DOCUMENTS

KR 1020100120295 A 11/2010
KR 1020170098053 A 8/2017
(Continued)

OTHER PUBLICATIONS

J Yu et. al., "Patterning Superatom Dopants on Transition Metal Dichalcogenides", Nano Lett, vol. 16, Iss. 5, pp. 3385-3389. Apr. 15, 2016.

*Primary Examiner* — Nicholas J Tobergte
(74) *Attorney, Agent, or Firm* — Bridgeway IP Law Group, PLLC; Jihun Kim

(57) ABSTRACT

As a field effect transistor (FET) having a transition metal dichalcogenide capped with a hydrocarbon (HC) protective film according to a preferred embodiment as a channel layer forms a dielectric thin film having a large area of a centimeter scale as a protective film on the surface of the transition metal dichalcogenide, the problem of lowering the electrical performance of the field effect transistor, which is generated due to scattering or trapping of carriers within the channel as impurity molecules such as oxygen, moisture, and the like existing in the surrounding environment are adsorbed on the surface of the transition metal dichalcogenide and act as defects, can be solved, and stability of long-term storage can be improved.

13 Claims, 29 Drawing Sheets

(51) Int. Cl.
*H01L 23/00* (2006.01)
*H01L 23/29* (2006.01)
*H10D 30/01* (2025.01)
*H10D 30/47* (2025.01)

(56) References Cited

U.S. PATENT DOCUMENTS

2019/0245102 A1* 8/2019 Moriwaki ............ H10H 20/833
2023/0373810 A1* 11/2023 Ly ......................... C23C 16/342

FOREIGN PATENT DOCUMENTS

| | | |
|---|---|---|
| KR | 1020220107576 A | 8/2022 |
| KR | 1020230050987 A | 4/2023 |
| KR | 1020230058333 A | 5/2023 |

* cited by examiner

FIELD EFFECT TRANSISTOR INCLUDING TRANSITION METAL DICHALCOGENIDE COVERED WITH PROTECTIVE LAYER, AND METHOD OF MANUFACTURING THE SAME

CROSS-REFERENCE TO RELATED APPLICATION

This application claims priority to and the benefit of Korean Patent Application No. 10-2024-0050234 filed in the Korean Intellectual Property Office on Apr. 15, 2024, the entire contents of which are incorporated herein by reference.

BACKGROUND OF THE INVENTION

Field of the Invention

The present invention relates to a field effect transistor, and more specifically, to a field effect transistor including a transition metal dichalcogenide covered with a protective film, and a method of manufacturing the same.

Background of the Related Art

Two-dimensional (2D) semiconductor materials including transition metal dichalcogenides (TMDs) have advantages such as excellent on/off current ratio characteristics, high carrier mobility, and the like, and are studied as a core material used as a channel layer in electronic devices. However, when the surface of a transition metal dichalcogenide material is exposed to various external environments, such as the atmospheric environment or a device manufacturing process, various types of molecules are adsorbed on the surface, and these act as a scattering or trapping center, and cause local non-uniform electron distribution within the channel, lower carrier mobility, and generate hysteresis between forward and reverse biases, and thus lower reliability of semiconductor devices. Therefore, a protective film provided on the surface of the transition metal dichalcogenide is required to prevent defects generated by adsorption of impurity molecules on the surface and to provide a shielding effect for maintaining electrical performance.

SUMMARY OF THE INVENTION

Therefore, the present invention has been made in view of the above problems, and it is an object of the present invention to provide a field effect transistor including a protective film and a method of manufacturing the same.

To accomplish the above object, according to a preferred example of the present invention, there is provided a field effect transistor comprising: a channel layer provided on a substrate and including a transition metal dichalcogenide thin film; a plurality of electrodes arranged on a portion of the channel layer to be spaced apart from each other; and a protective film for covering the channel layer or the channel layer and the electrodes, forming a van der Waals gap by being in contact with the transition metal dichalcogenide thin film, and containing hydrocarbon.

The hydrocarbon may be amorphous, and partially include a crystalline carbon structure showing a 1,350 $cm^{-1}$ peak (D) and/or a 1,600 $cm^{-1}$ peak (G) in Raman spectroscopy.

The dielectric constant of the protective film may be 10 to 40.

The thickness of the protective film may be 0.1 to 5 nm.

The van der Waals gap may be 1 to 5 Å.

The hydrocarbon thin film protective film may maintain electrical performance of the field effect transistor even when the FET is exposed to an external environment, and maintaining electrical performance of the field effect transistor may be measuring a reduction rate of electron mobility to be lower than 10% when contact with air and oxygen is continued for several months.

To accomplish the above object, according to a preferred embodiment of the present invention, there is provided a method of manufacturing a field effect transistor, the method comprising the steps of: growing a hydrocarbon thin film on a substrate (S01); preparing a field effect transistor having a channel layer including a transition metal dichalcogenide thin film and a plurality of electrodes disposed to be spaced apart from each other on remaining portions of the channel layer (S02); and covering the transition metal dichalcogenide thin film and the electrodes by transferring the hydrocarbon thin film, and forming a van der Waals gap between the hydrocarbon thin film and the transition metal dichalcogenide thin film (S03).

The step of growing a hydrocarbon thin film may include low temperature CVD (LTCVD), inductively coupled plasma-CVD (ICP-CVD), low pressure CVD (LPCVD), atmospheric pressure CVD (APCVD), metal organic CVD (MOCVD), plasma-enhanced CVD (PECVD), or two or more methods selected therefrom.

The growth temperature at the step of growing a hydrocarbon thin film may be in a range of 500 to 900 K.

The dielectric constant of the hydrocarbon thin film may be 10 to 40.

The hydrocarbon may be amorphous, and partially include a crystalline carbon structure showing a 1,350 $cm^{-1}$ peak (D) and/or a 1,600 $cm^{-1}$ peak (G) in Raman spectroscopy.

The thickness of the hydrocarbon thin film may be 0.1 to 5 nm.

The van der Waals gap may be 1 to 5 Å.

The hydrocarbon thin film may maintain electrical performance of the field effect transistor even when the FET is exposed to an external environment, and maintaining electrical performance of the field effect transistor may be measuring a reduction rate of electron mobility to be lower than 10% when contact with air and oxygen is continued for several months.

DETAILED DESCRIPTION OF THE PREFERRED EMBODIMENT

Figure 1:
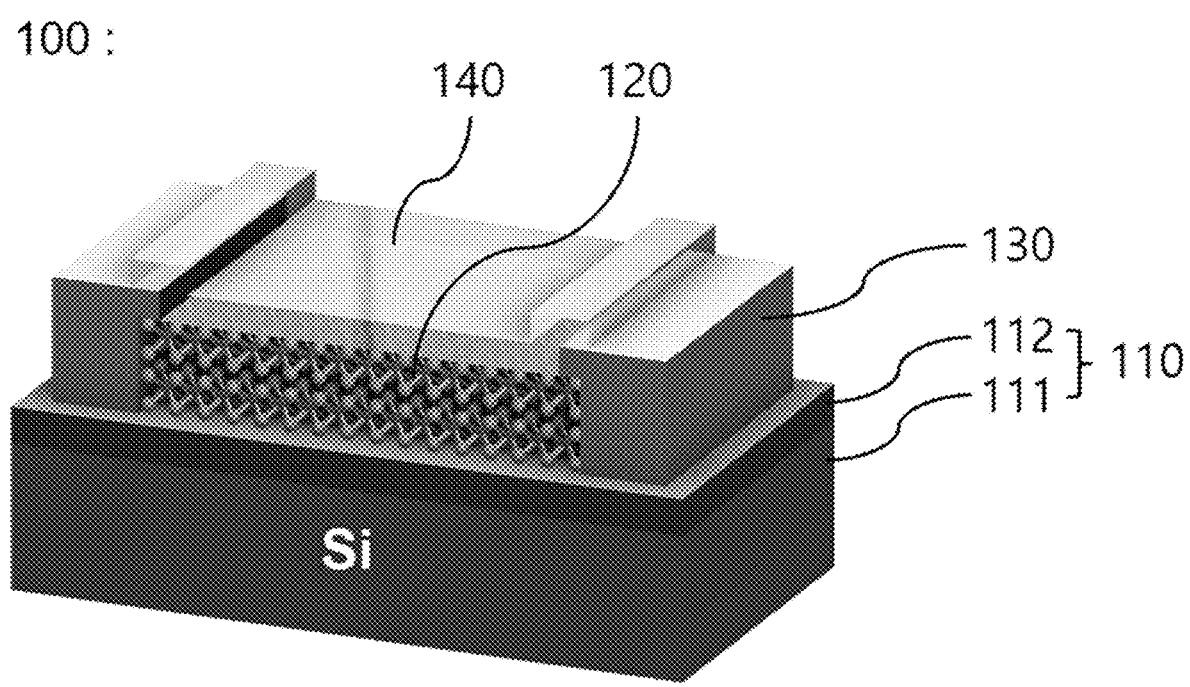
FIG. 1 is a mimetic view showing the cross-section of a field effect transistor according to an embodiment of the present invention.

Hereinafter, preferred embodiments of the present invention will be described in detail with reference to the accompanying drawings. The advantages and features of the present invention and the methods for achieving them will become apparent with reference to the embodiments described below in detail, together with the accompanying drawings. However, the present invention is not limited to the embodiments disclosed below, and may be implemented in various different forms, and the embodiments are provided only to make the disclosure of the present invention complete and to fully inform those skilled in the art of the scope of the present invention, and the present invention is defined only by the scope of the claims. Like reference numerals refer to like elements throughout the specification.

Unless defined otherwise, all terms (including technical and scientific terms) used in this specification may be used as a meaning that can be commonly understood by those skilled in the art. In addition, terms defined in commonly used dictionaries are not to be ideally or excessively interpreted unless explicitly and specifically defined. The terms used in this specification are for describing the embodiments and are not intended to limit the present invention. In this specification, singular forms also include plural forms unless specifically stated in the phrases.

The terms "comprises" and/or "comprising" used in the specification means that a mentioned component, step, operation, and/or element does not exclude presence or addition of one or more other components, steps, operations, and/or elements.

Field Effect Transistor Including a Transition Metal Dichalcogenide Channel Layer Covered with a Hydrocarbon Protective Layer FIG. 1 is a mimetic view showing the cross-section of a field effect transistor according to an embodiment of the present invention.

Referring to FIG. 1, a field effect transistor according to an embodiment of the present invention includes a channel layer 120, a plurality of electrodes 130, and a protective film 140. More specifically, the channel layer 120 is provided on a substrate 110 and includes a transition metal dichalcogenide thin film, and the electrodes 130 are arranged on a portion of the channel layer 120 to be spaced apart from each other, and the protective film 140 covers the channel layer 120 or the channel layer 120 and the electrodes 130, forms a van der Waals gap by being in contact with the transition metal dichalcogenide thin film, and contains hydrocarbon.

The substrate 110 may use a semiconductor substrate of silicon, Silicon-on-insulator (SOI), or the like as a semiconductor material, and specifically, may use a silicon substrate 111 having a dielectric layer 112, such as silicon oxide or the like, formed on the surface at a thickness ranging from several to several hundred nanometers. In addition, the substrate 110 may use a wide bandgap semiconductor substrate of silicon carbide (SiC), gallium nitride (GaN), gallium oxide ($Ga_2O_3$), or the like. The substrate 110 may use a substrate additionally doped with a dopant.

The channel layer 120 is a layer that performs a function of reacting to occurrence of an electrical change when an electrical signal is applied, and may include a two-dimensional semiconductor material. Specifically, the two-dimensional (2D) semiconductor material may have a structure in which strong covalent bonds are formed within a single layer and layers are bonded with a relatively small van der Waals force. The two-dimensional semiconductor material may be provided in the form of an ultra-thin film of a layered structure or particles of an ultra-thin plate shape, e.g., flakes, inside the channel layer 120, and may be a layered material provided as a monolayer or a multilayer of two or more layers. Specifically, the two-dimensional semiconductor material may be provided as a multilayer structure of several layers. Although the two-dimensional semiconductor material exhibits indirect transition characteristics in a bulk state or in a thin film state of a general thickness, it exhibits direct transition characteristics in the case of a single layer or having a thickness less than several layers, and as the two-dimensional semiconductor material has excellent photoreactivity and transparent and flexible characteristics, it may be applied as an optoelectronic device.

In addition, the two-dimensional semiconductor material has a layered structure, in which each layer maintains a very strong covalent bond between constituent atoms, and the layers are bonded by a weak van der Waals force. Since the two-dimensional semiconductor material has no dangling bonds extending toward the outside of the layer and only two-dimensionally interacts with constituent atoms in principle, carrier transport shows a ballistic transport pattern unlike conventional thin films or bulk materials, and thus may be applied as a high-mobility, high-speed, low-power semiconductor.

The two-dimensional semiconductor material may include a transition metal dichalcogenide (TMD). Specifically, the transition metal dichalcogenide material may be expressed as chemical formula $MX_2$, wherein M denotes a transition metal element and may include at least any one selected from, for example, Mo, W, Nb, V, Ta, Ti, Zr, Hf, Tc, Re, Ru, Co, Pd, Pt, Cu, Ga, In, Sn, Ge, Pb, and a combination thereof, and X denotes a chalcogen element and may include at least any one selected from S, Se, Te, and a combination thereof. Specifically, the transition metal dichalcogenide material may include at least any one selected from $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PdTe_2$, and a combination thereof. More specifically, the transition metal dichalcogenide material may include $MoS_2$, $MoSe_2$, $WS_2$, $WSe_2$, or at least any one selected therefrom, and in a specific example, the transition metal dichalcogenide material may include $MoSe_2$, but it is not limited thereto.

The crystal structure of the transition metal dichalcogenide material forms a covalent bond between the transition metal M and the chalcogen element X, and may have a hexagonal structure in the plane direction on the basis of the covalent bond. The crystal structure may also be changed through an additional phase change or doping step.

In particular, the transition metal dichalcogenide may be provided in the form of an ultra-thin film of a layered structure or particles of an ultra-thin plate shape, e.g., flakes, and may be provided as a monolayer or a multilayer of two or more layers. When the transition metal dichalcogenide material is provided in the form of flakes, flakes having an average diameter of a scale ranging from several nanometers to several micrometers may be used. For example, the average diameter of the flakes may be 1 nm to 100 μm.

The electrode 130 may include a metal or a metal compound. The metal or metal compound may contain metal elements including at least any one selected from Ti, Ni, Au, Ag, and a combination thereof, and any type of metal element suitable for being applied in an electronic device as a metal electrode, metal interconnection, or the like may be used without limitation.

The protective film 140 may be a passivation film that covers the transition metal dichalcogenide thin film to prevent various problems that may occur when the transition metal dichalcogenide thin film is exposed to an external environment. When the surface of the transition metal dichalcogenide material is exposed to various external environments, such as the atmospheric environment or a field effect transistor manufacturing process, various types of molecules are adsorbed on the surface, and these act as a scattering or trapping center, and cause local non-uniform electron distribution within the channel, lower carrier mobility, and generate hysteresis between forward and reverse biases, and thus lower performance of the field effect transistor. Therefore, a protective film 140 may be provided on the surface of the transition metal dichalcogenide to prevent defects generated by adsorption of impurity molecules, such as oxygen, moisture, or the like, on the surface and to provide a shielding effect for maintaining electrical performance.

The protective film 140 covers the surface of the channel layer 120 and may perform a function of maintaining electrical performance of the field effect transistor (FET) even when the FET is exposed to an external environment.

The protective film 140 may contain hydrocarbon (HC). The hydrocarbon (HC) refers to a compound having bonding carbon atoms and hydrogen atoms as the main structure, and it is an amorphous material that randomly contains $sp^3$ bonds or $sp^2$ bonds. Specifically, it may mean a chemical structure that is not solely formed of $sp^3$ bonds or $sp^2$ bonds, and may mean a structure in which dangling bonds, i.e., fixed free radicals, of a predetermined ratio are contained. Alternatively, it may mean a structure that partially contains $sp^3$ bonds or $sp^2$ bonds of crystalline material and contains non-crystalline materials in the other area. For example, it may partially include a crystalline carbon structure in which a 1,350 $cm^{-1}$ peak (D) and/or a 1,600 $cm^{-1}$ peak (G), which means crystalline carbon, appears in Raman spectroscopy of a specific example of the present invention. The hydrocarbon (HC) film is an amorphous material and may have characteristics such as a permittivity or the like of a predetermined level or higher compared to hydrocarbon materials of a crystalline structure represented by graphene, diamond, or the like. In addition, the hydrocarbon (HC) film applied in the present invention is an amorphous material, and unlike the crystalline materials, it is easy to grow in a large area and perform a transfer process.

The dielectric constant of the hydrocarbon (HC) may be 10 to 40, specifically 15 to 35, and more specifically 20 to 30. When the hydrocarbon (HC) has a dielectric constant within the range, it may be preferable since it can be used for controlling a gate that uses a high dielectric (high K). In addition, a doping or modification step through an additional chemical treatment may be added to provide desired dielectric properties to the hydrocarbon (HC). In a specific example, the dielectric constant of the hydrocarbon (HC) may be 26, but it is not limited thereto.

In addition, the hydrocarbon (HC) may perform a function of maintaining electrical performance of the field effect transistor (FET) even when the FET is exposed to an external environment. Maintaining electrical performance of the field effect transistor (FET) may mean that the reduction rate of electron mobility of the field effect transistor is low when contact with air and oxygen is continued for several months. The reduction rate of electron mobility of the field effect transistor may be measured to be lower than 10%, specifically lower than 8%, and more specifically lower than 6%. In a specific example, the reduction rate of electron mobility may be 5.5%, but it is not limited thereto.

In addition, maintaining the electrical performance of the field effect transistor (FET) may mean that increase in the hysteresis of the field effect transistor is small when the FET is exposed to air and oxygen for several months. Increase in the hysteresis of the field effect transistor may be measured to be lower than 10 $V_{th}$ specifically, and lower than 7 $V_{th}$ more specifically. In a specific example, increase in the hysteresis of the field effect transistor may be 5 $V_{th}$, but it is not limited thereto.

Furthermore, the hydrocarbon (HC) may provide a characteristic of improving electron mobility of the field effect transistor by 30 to 80% as it is in contact with the transition metal dichalcogenide thin film. In a specific example, although electron mobility (u) of a transition metal dichalcogenide thin film without a protective film is about 20 to 30 $cm^2V^{-1}s^{-1}$, electron mobility (u) of a transition metal dichalcogenide thin film with a hydrocarbon (HC) protective film can be improved to 40 to 50 $cm^2V^{-1}s^{-1}$, but it is not limited thereto.

In addition, the hydrocarbon (HC) may provide a characteristic of reducing hysteresis between forward bias and reverse bias sweepings as it is in contact with the transition metal dichalcogenide thin film. In a specific example, hysteresis of a transition metal dichalcogenide thin film without a protective film is as high as about 20 to 30 $V_{th}$, and hysteresis of a transition metal dichalcogenide thin film with a hydrocarbon (HC) protective film may be decreased to about 10 to 15 $V_{th}$, but it is not limited thereto.

Meanwhile, the channel layer with a hydrocarbon (HC) protective film formed thereon may exhibit a characteristic of maintaining electrical characteristics as the reduction rate of electron mobility is measured to be lower than 10% when it is in contact with the air and oxygen for several months. In a specific example, a field effect transistor including a channel layer with a hydrocarbon (HC) protective film formed thereon exhibits an electron mobility of about 35 to 40 $cm^2V^{-1}s^{-1}$ and increase the hysteresis of about 10 to 20 $V_{th}$, but after 3 months, it may still exhibit the electron mobility of 35 to 40 $cm^2V^{-1}s^{-1}$ and maintain increase in the hysteresis.

In addition, the hydrocarbon (HC) may have physical properties such as moisture permeability, low oxygen transmission rate, and chemical resistance to perform a function of maintaining electrical performance of the field effect transistor even when the FET is exposed to an external environment.

The hydrocarbon (HC) may be provided in the form of a thin film, and the hydrocarbon (HC) thin film may exhibit a characteristic of a smooth and continuous bottom surface without a pinhole, and may also be a film having a horizontal or vertical length of a scale ranging from several to several tens of centimeters. In addition, the thickness of the hydrocarbon (HC) film may be several nanometers thick, and may be 1 to 5 nm, specifically 2 to 3 nm, but it is not limited thereto.

The hydrocarbon (HC) thin film may grow in a chemical vapor deposition (CVD) method, and it may include, for example, low temperature CVD (LTCVD), inductively coupled plasma-CVD (ICP-CVD), low pressure CVD (LPCVD), atmospheric pressure CVD (APCVD), metal organic CVD (MOCVD), plasma-enhanced CVD (PECVD), and two or more methods selected therefrom. In a specific example, inductively coupled plasma-CVD (ICP-CVD) may be used for growth of the hydrocarbon (HC) thin film, but it is not limited thereto.

The hydrocarbon (HC) thin film may have a sufficiently large area and may be formed as a protective film by covering the channel layer 120 or both the channel layer 120 and the electrode 130. At this point, the hydrocarbon (HC) thin film may perform a passivation function of blocking exchange of materials with external environments and providing a shielding effect so that molecules such as oxygen and moisture may not be adsorbed on the surface of the channel layer 120 of the field effect transistor to lower the electrical performance of the field effect transistor.

At this point, the hydrocarbon (HC) thin film may be in close contact with the channel layer 120 and the electrode 130 in the process of being formed as a protective film, and in order to accelerate the contact process, an additional low-temperature heat treatment, for example, a process of low-temperature heat treatment at a temperature of 80 to 120° C., may be added.

The hydrocarbon (HC) thin film may be positioned to be in contact with the channel layer 120 described above to be in contact with a two-dimensional semiconductor material, for example, a transition metal dichalcogenide thin film, to form a van der Waals gap at the interface thereof. The van der Waals gap may be a gap of 1 nm or less, i.e., a gap of several angstroms. The van der Waals gap may be 1 to 5 Å, and may be 3 Å in a specific example, but it is not limited thereto.

Figure 2:
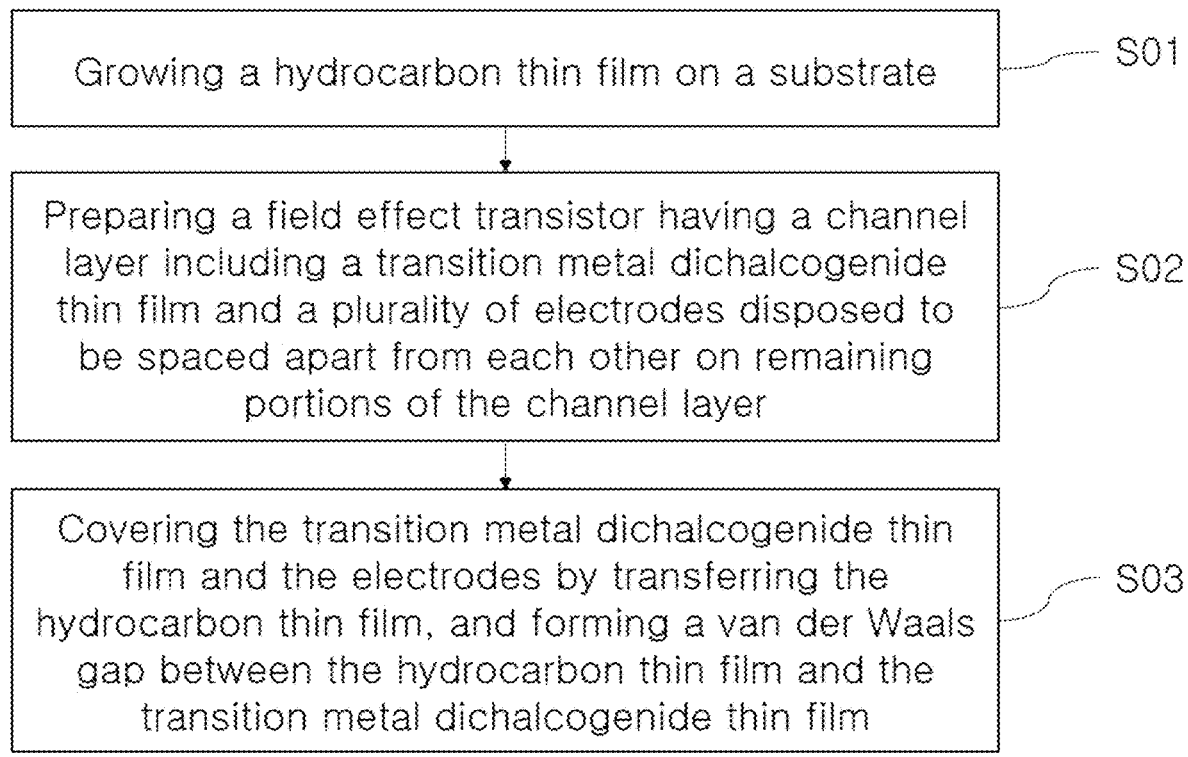
FIG. 2 is a flowchart illustrating a method of manufacturing a field effect transistor according to an embodiment of the present invention.

Method of Manufacturing a Field Effect Transistor Including a Transition Metal Dichalcogenide Channel Layer Covered with a Hydrocarbon Protective Film FIG. 2 is a flowchart illustrating a method of manufacturing a field effect transistor according to an embodiment of the present invention.

Referring to FIG. 2, a method of manufacturing a field effect transistor including a transition metal dichalcogenide channel layer covered with a hydrocarbon protective film according to an embodiment of the present invention may first include a step of growing a hydrocarbon thin film on a substrate (S01).

The step of growing a hydrocarbon thin film may use, for example, low temperature CVD (LTCVD), inductively coupled plasma-CVD (ICP-CVD), low pressure CVD (LPCVD), atmospheric pressure CVD (APCVD), metal organic CVD (MOCVD), plasma-enhanced CVD (PECVD), or two or more methods selected therefrom. In a specific example, the step of growing a hydrocarbon thin film may use the inductively coupled plasma-CVD (ICP-CVD), but it is not limited thereto.

In order to grow the hydrocarbon thin film on a substrate, a silicon substrate having a dielectric layer of a thickness ranging from several to several hundred nanometers, such as silicon oxide, formed on the surface may be used as the substrate.

A metal catalyst layer may be formed on the substrate as a catalyst for growth of hydrocarbons. The metal catalyst layer may be a metal thin film deposited at a thickness of several to several hundred nanometers, and may also be a thin film of nano-sized metal catalyst particles evenly dispersed thereon. The metal catalyst may use at least any one selected from, for example, Au, Ag, Cu, Pt, Zn, Fe, Ti, Sn, In, Bi, and Ni. In a specific example, the metal catalyst may be Ag, and the thickness of the metal catalyst layer may be 150 to 250 nm, but they are not limited thereto.

Next, a step of positioning the substrate with a metal catalyst layer formed thereon in a chamber, and heating the substrate to reach the growth temperature of hydrocarbons, together with injection of hydrocarbon gas and carrier gas, may be performed.

A hydrocarbon material containing carbon of C1 to C3 and hydrogen, such as methane, ethane, propane, or the like, may be used as the hydrocarbon gas, and in a specific example, methane ($CH_4$) may be used as the hydrocarbon gas.

The growth temperature of the hydrocarbon may be in a range of 500 to 900 K. The hydrocarbon grown at a growth temperature within the range is amorphous and has a structure that partially includes a crystalline carbon structure showing a 1,350 $cm^{-1}$ peak (D) and/or a 1,600 $cm^{-1}$ peak (G) in Raman spectroscopy, and a hydrocarbon material indicating a permittivity of about 26 may be manufactured. As the chemical structure of the hydrocarbon grown at a growth temperature below the range is configured only of an amorphous material, the carbon structure thereof may not be grasped accurately, and when a growth temperature exceeding the range is applied, the hydrocarbon may be manufactured as a material having a crystalline carbon structure with high crystallinity, and it is difficult to manufacture a hydrocarbon thin film having desired physical properties. Specifically, the growth temperature of the hydrocarbon may be 600 to 800 K, and more specifically, 650 to 750 K. In a specific example, the growth temperature of the hydrocarbon may be 737 K, but it is not limited thereto.

The hydrocarbon thin film grown in the method as described above may grow to be an area as large as the size of the substrate, and may be formed to be an area of a scale ranging, for example, from several to several tens of square centimeters.

A polymer coating, for example, a Poly methyl methacrylate (PMMA) coating is manufactured by applying and curing a polymer solution on the surface of the hydrocarbon thin film grown on the substrate, and a polymer coating with a hydrocarbon thin film formed thereon may be prepared by separating it from the substrate. Through this, a protective film may be formed by transferring the hydrocarbon thin film on the field effect transistor described below.

Thereafter, a step of preparing a field effect transistor having a channel layer including a transition metal dichalcogenide thin film and a plurality of electrodes disposed to be spaced apart from each other on remaining portions of the channel layer (S02) may be included.

The step of preparing the transition metal dichalcogenide thin film and the electrodes may be used in the same manner as described in the part of the field effect transistor including a transition metal dichalcogenide channel layer covered with a hydrocarbon protective film described above, and detailed description thereof will be omitted for brief description.

Specifically, a method of forming a transition metal dichalcogenide thin film may use a mechanical method such as a method of mechanically peeling off from a layered bulk material using an adhesive material, or may use a chemical method such as a molecular beam epitaxy method of growing crystal based on a seed well grown under a high vacuum or ultra-high vacuum condition as an epitaxial growth method of depositing a thin film of a single crystal, or a thermochemical vapor deposition method that assists molten salt. However, the methods described above are examples, and known non-limiting methods may be used to form a transition metal dichalcogenide layer.

The electrode may include a metal or a metal compound. The metal or metal compound may contain metal elements including at least any one selected from Ti, Ni, Au, Ag, and a combination thereof, and any type of metal element suitable for being applied in an electronic device as a metal electrode, metal interconnection, or the like may be used without limitation.

The step of depositing an electrode may use a method of depositing a metal thin film to which energy of a level that does not induce defect of the channel layer is applied, for example, a method such as an electron beam evaporator, a thermal evaporator, sputtering, or the like, without limitation.

Next, a step of covering the transition metal dichalcogenide thin film and the electrodes by transferring the hydrocarbon thin film, and forming a van der Waals gap between the hydrocarbon thin film and the transition metal dichalcogenide thin film (S03) may be included.

The polymer coating with a hydrocarbon thin film formed thereon may be positioned so that the portion where the hydrocarbon is formed and the portion where the transition metal dichalcogenide film is positioned are bonded. Then, the manufactured polymer/hydrocarbon/transition metal dichalcogenide thin film is heat-treated at a low temperature, for example, at a temperature of 80 to 120° C., to flatten the polymer coating and, at the same time, enhance the contacting force between the hydrocarbon thin film and the transition metal dichalcogenide film.

The van der Waals gap may be formed at the interface where the hydrocarbon thin film and the transition metal dichalcogenide thin film are in contact. In other words, the hydrocarbon thin film and the transition metal dichalcogenide thin film may directly contact to be bonded by the van der Waals force (vdW). As the van der Waals gap is formed, dangling bonds with high surface reactivity can be removed, and inherent physical properties of the channel layer can be preserved, and as carrier leakage within the channel layer can be blocked and a quasi-ideal interface can be formed, there is an effect of improving carrier mobility within the channel layer including the transition metal dichalcogenide thin film and reducing hysteresis of the field effect transistor.

The van der Waals gap may be a gap of 1 nm or less, i.e., a gap of several angstroms. The van der Waals gap may be 1 to 5 Å, and may be 3 Å in a specific example, but it is not limited thereto.

Hereinafter, the present invention will be described in more detail using embodiments and comparative examples. However, the embodiments and comparative examples described below are provided for illustrative purposes only, and the scope of the present invention is not limited thereto.

Manufacturing Example 1: Manufacture a Hydrocarbon (HC) Film in an ICP-CVD Method As a method of forming a hydrocarbon (HC) thin film using inductively coupled plasma chemical vapor deposition (ICP-CVD), first, an $SiO_2$/Si substrate, on which Ag of a 200 nm thick is deposited as a catalyst for growth of hydrocarbon (HC), is placed in a chamber, and the chamber temperature is increased to the growth temperature (737 K) of the hydrocarbon (HC) together with injection of 20 sccm of $CH_4$ gas and 100 sccm of a mixture of Ar and $H_2$ gases (90:10% by volume). Then, inductively coupled plasma (ICP) is introduced under the condition of 600 W of power and 1 Torr of chamber pressure while 20 sccm of $CH_4$ gas is injected. Through this, the hydrocarbon (HC) film is grown in the ICP-CVD method.

Manufacturing Example 2: Manufacture a Multilayer $MoSe_2$ Field Effect Transistor (FET)

To manufacture a multilayer $MoSe_2$ field effect transistor (FET), multilayer $MoSe_2$ flakes are manufactured first by mechanically peeling off bulk $MoSe_2$ using a scotch tape, and then transferred onto a p-Si substrate (2 cm×2 cm) on which an $SiO_2$ dielectric layer of a 300 nm thick is formed. To remove residual chemical materials in the process of transferring the multilayer $MoSe_2$ flakes, the substrate is immersed in acetone for 2 hours, rinsed with isopropyl alcohol, and then dried. In the case of source and drain electrodes, Ti of a 20 nm thick and Ni of a 200 nm thick are deposited using electron beam evaporation, and patterning of the electrodes is performed using photolithography and wet etching. Thereafter, annealing is performed for 2 hours at 200° C. in an atmosphere of Ar+H$_2$ mixed gas to remove organic residues and reduce contact resistance between the metal electrodes and MoSe$_2$ as a channel layer. Tens to hundreds of multilayer MoSe$_2$ field effect transistors (FETs) are formed on the substrate of a 2 cm×2 cm size.

Embodiment 1: Manufacture a Field Effect Transistor (FET) Using a Hydrocarbon (HC) Film as a Protective Film A poly methyl methacrylate (PMMA) solution is applied, coated, and dried on the surface of the hydrocarbon (HC) film manufactured in Manufacturing Example 1. A PMMA/HC coating is manufactured by etching the formed PMMA/HC/substrate with a hydrogen fluoride (HF) etching solution for about 3 minutes, and washed with deionized water for 15 minutes. Thereafter, a protective film transfer process is performed by placing the PMMA/HC coating with the hydrocarbon film formed thereon on the multilayer MoSe$_2$ FET of a 2 cm×2 cm size manufactured in Manufacturing Example 2 and positioning the PMMA/HC coating to cover the hundreds of multilayer MoSe$_2$ FETs. The manufactured PMMA/HC/multilayer MoSe$_2$ FET is heated on a 373 K hot plate for 1 day to planarize the PMMA film, and a process of accelerating adhesion of the MoSe$_2$ layer and the hydrocarbon (HC) is performed. Then, the PMMA is removed by washing with acetone. The HC/multilayer MoSe$_2$ FET manufactured in this way is rinsed with isopropanol and dried by heating at 100° C. for 15 minutes, and a multilayer MoSe$_2$ field effect transistor (FET) capped with a hydrocarbon (HC) protective film is manufactured.

Comparative Example 1: Manufacture a Field Effect Transistor (FET) without a Protective Film A field effect transistor without a protective film is manufactured using the multilayer MoSe$_2$ field effect transistor (FET) of Manufacturing Example 2 as is.

Experimental Example 1: Measure Physical Properties of a Hydrocarbon Protective Film FIG. 4 is a view showing optical photographs of a hydrocarbon (HC) film according to Manufacturing Example 1 of the present invention, FIG. 5 is a view showing a result of Raman spectroscopy on a hydrocarbon (HC) film according to Manufacturing Example 1 of the present invention, and FIG. 6A is a view showing a result of atomic force microscopy (AFM), and FIG. 6B is a view showing a result of high-magnification atomic force microscopy (AFM), and a result of surface height scanned along the red solid line, for a hydrocarbon (HC) film according to Manufacturing Example 1 of the present invention.

Figure 4:
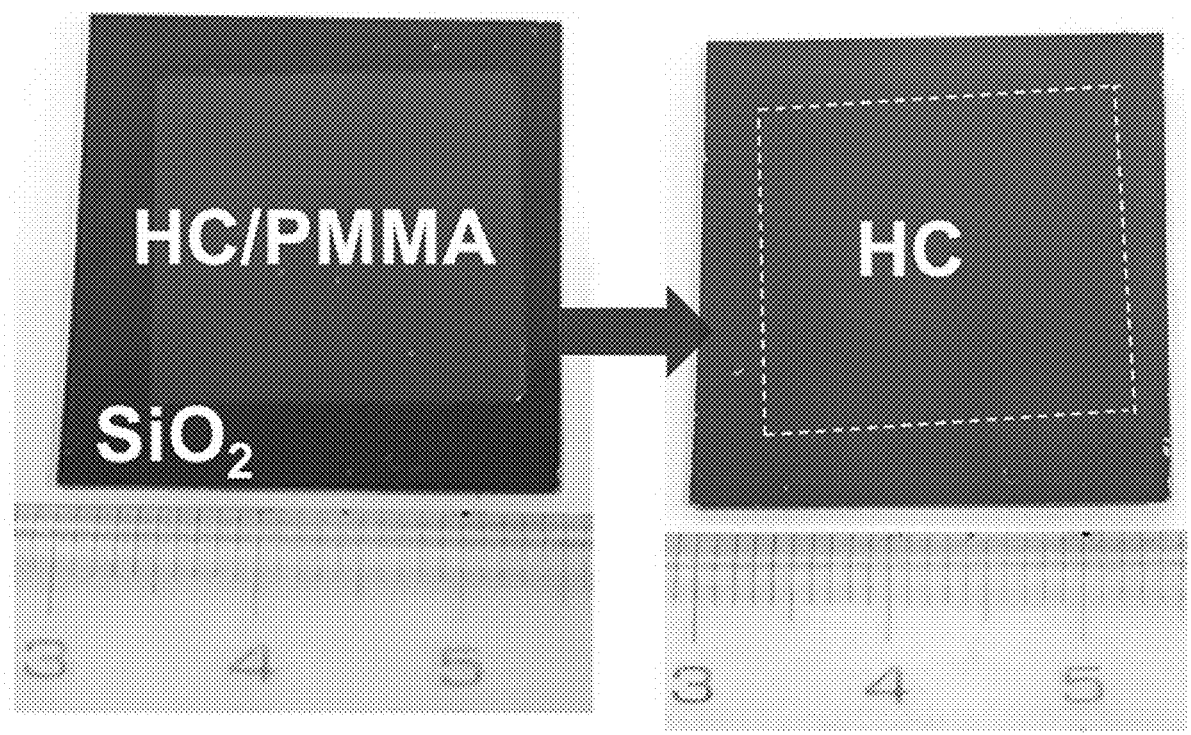
FIG. 4 is a view showing optical photographs of a hydrocarbon (HC) film according to Manufacturing Example 1 of the present invention.
Figure 5:
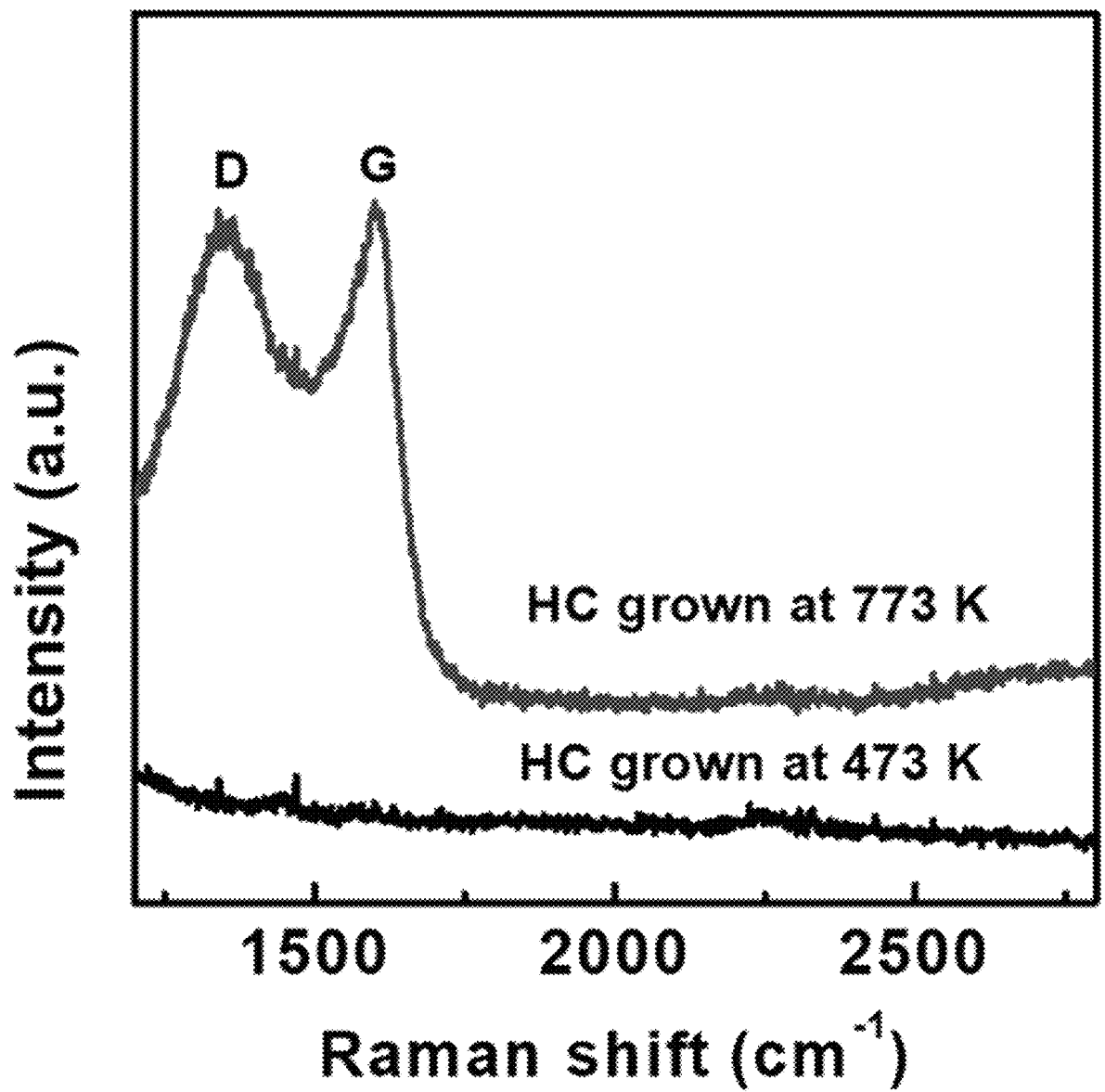
FIG. 5 is a view showing a result of Raman spectroscopy on a hydrocarbon (HC) film according to Manufacturing Example 1 of the present invention.
Figure 6A:
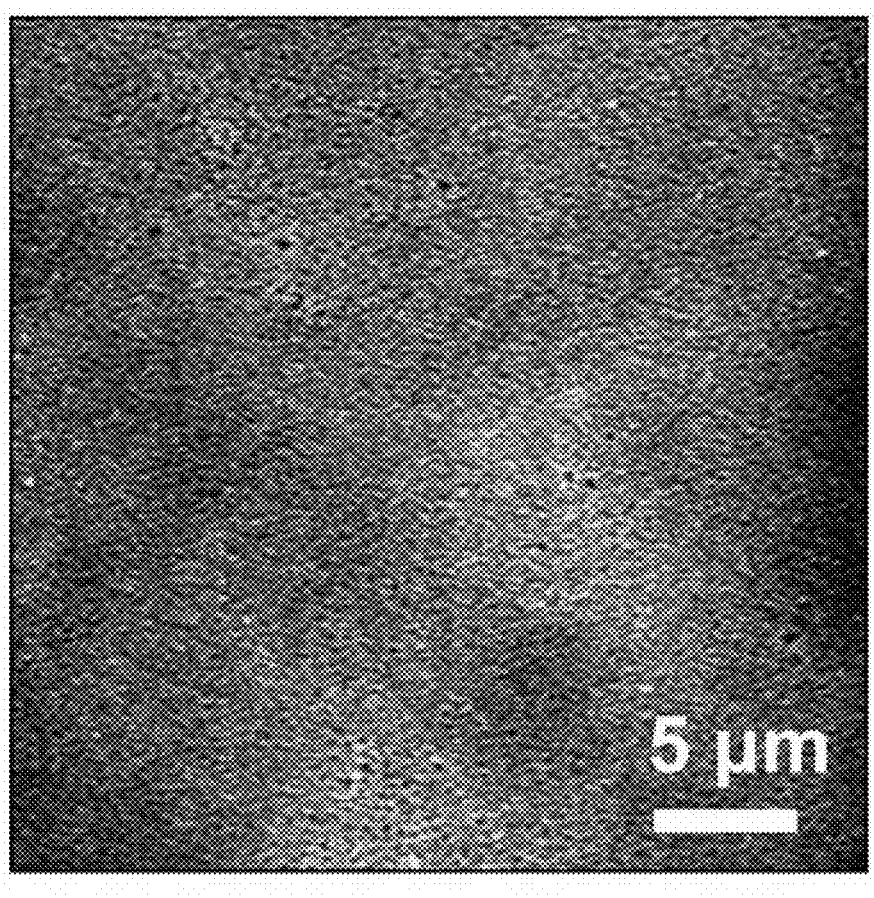
FIG. 6A is a view showing a result of atomic force microscopy (AFM)
Figure 6B:
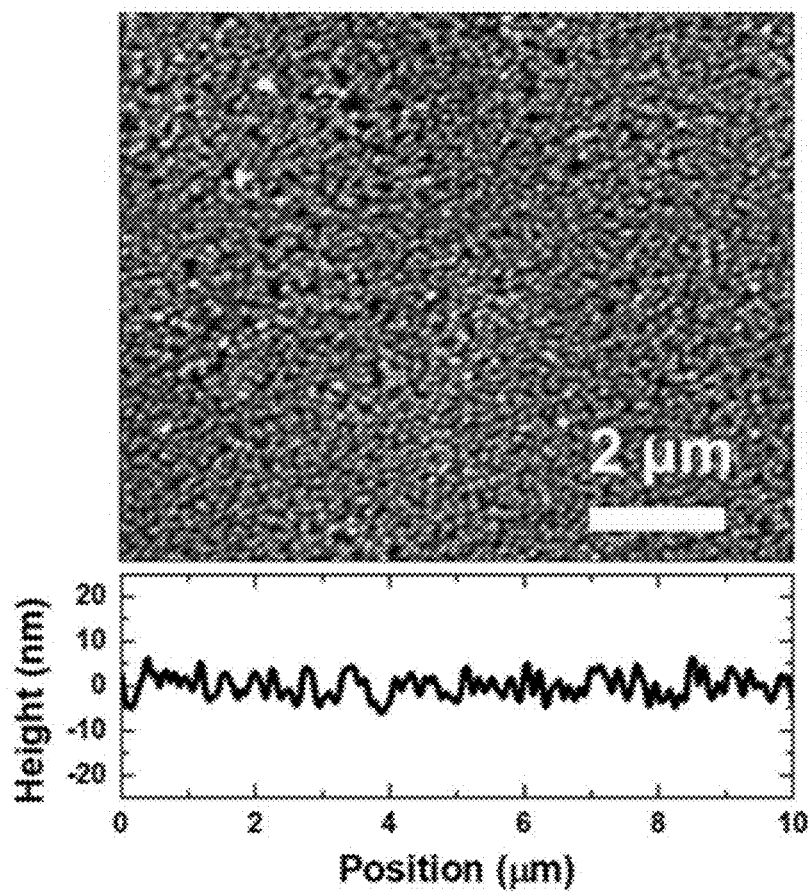
FIG. 6B is a view showing a result of high-magnification atomic force microscopy (AFM) and a result of surface height scanned along the red solid line, for a hydrocarbon (HC) film according to Manufacturing Example 1 of the present invention.

Referring to FIGS. 4, 6A and 6B, it can be confirmed that the hydrocarbon (HC) protective film according to Manufacturing Example 1 of the present invention is manufactured as a large-area thin film having a size of about 2×2 cm, and is manufactured by immersing PMMA/HC/MoSe$_2$ in acetone for 24 hours and removing PMMA. The HC film synthesized at 737 K (Manufacturing Example 1) exhibits two carbon peaks, i.e., a 1,350 cm$^{-1}$ peak (D) and a 1,600 cm$^{-1}$ peak (G), which show broken and disordered crystallinity of a hexagonal honeycomb structure. On the other hand, in the case of the HC film synthesized at 473 K, intensity of the two peaks is not confirmed, and it can be inferred that the entropy of the carbon structure is increased, i.e., a meaning carbon structure is not confirmed. Next, it can be confirmed from the AFM image that the bottom surface of the HC film peeled off from the substrate has a smooth and continuous surface without a pinhole. Considering that it is a thin film uniformly deposited in a large area, it can be confirmed that the HC film grown according to Manufacturing Example 1 of the present invention is uniformly grown as the root mean square (RMS) of the surface roughness is only about 2.6 nm. Therefore, it can be inferred that electrical performance of the field effect transistor including the transition metal dichalcogenide will be excellent since a van der Waals gap without a defect can be formed in the HC/MoSe$_2$ stack.

Figure 7A:
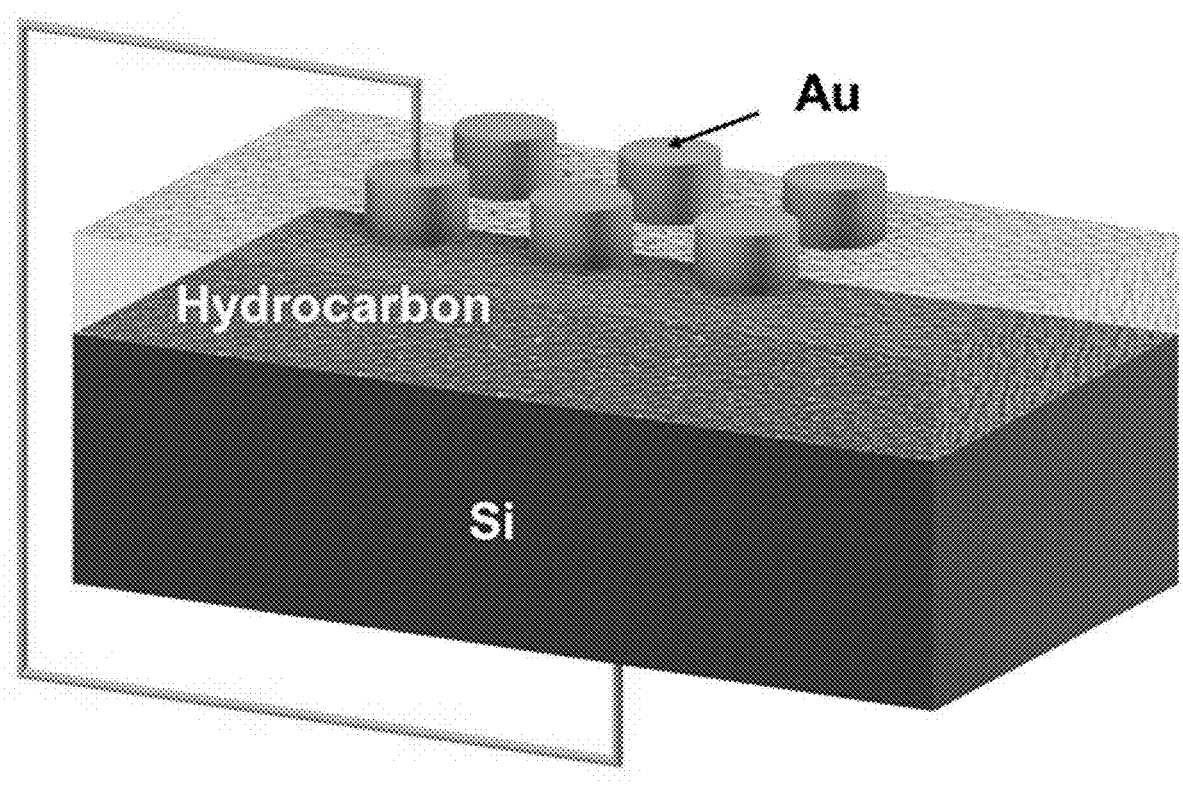
FIG. 7A is a view showing the structure of a metal-insulator-semiconductor (MIS) element for measuring dielectric constant.
Figure 7B:
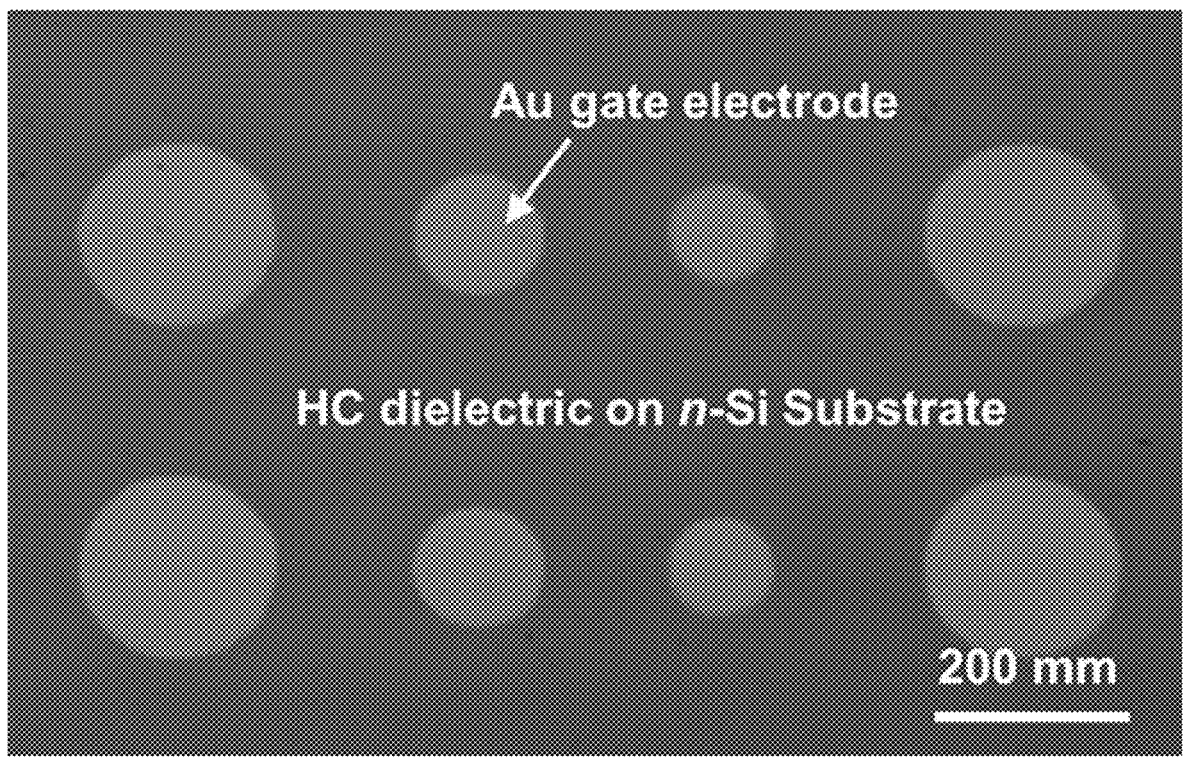
FIG. 7B is a view showing an optical microscope photograph of the MIS element.
Figure 7C:
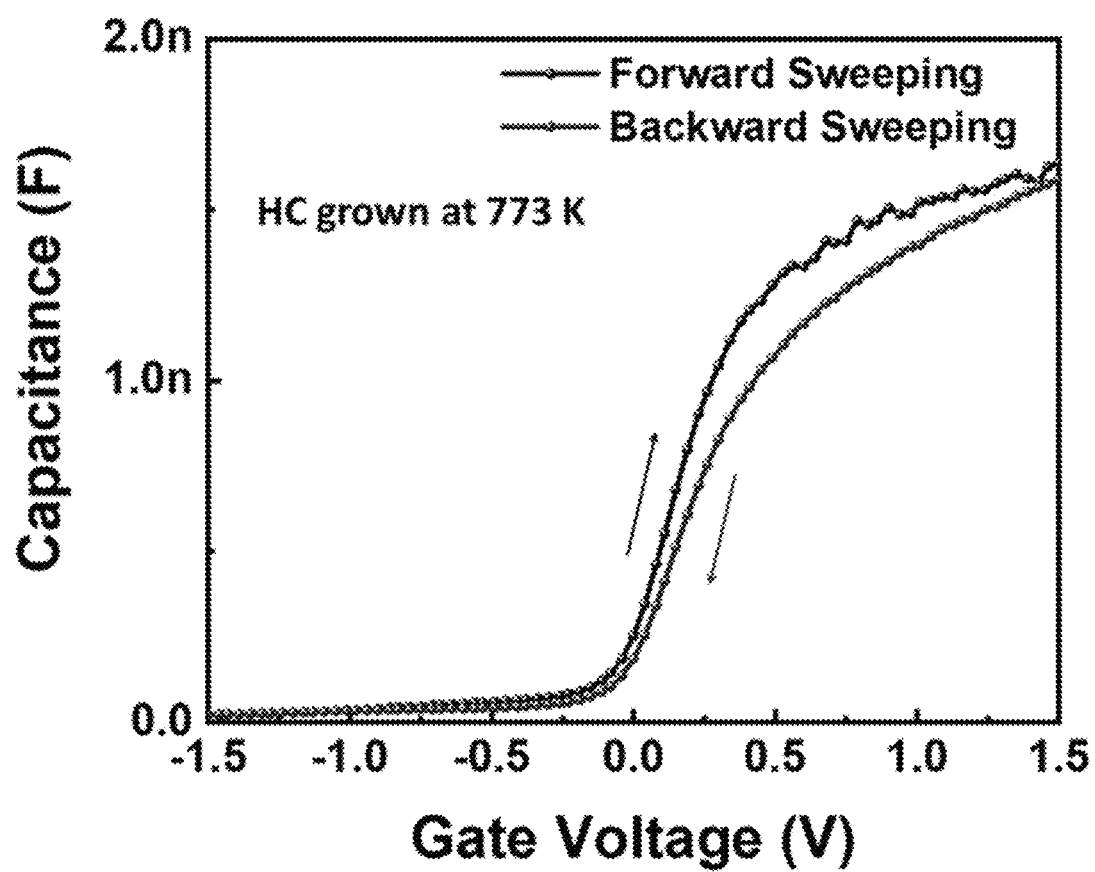
FIG. 7C is a view showing Capacitance-voltage (C-V)
Figure 7D:
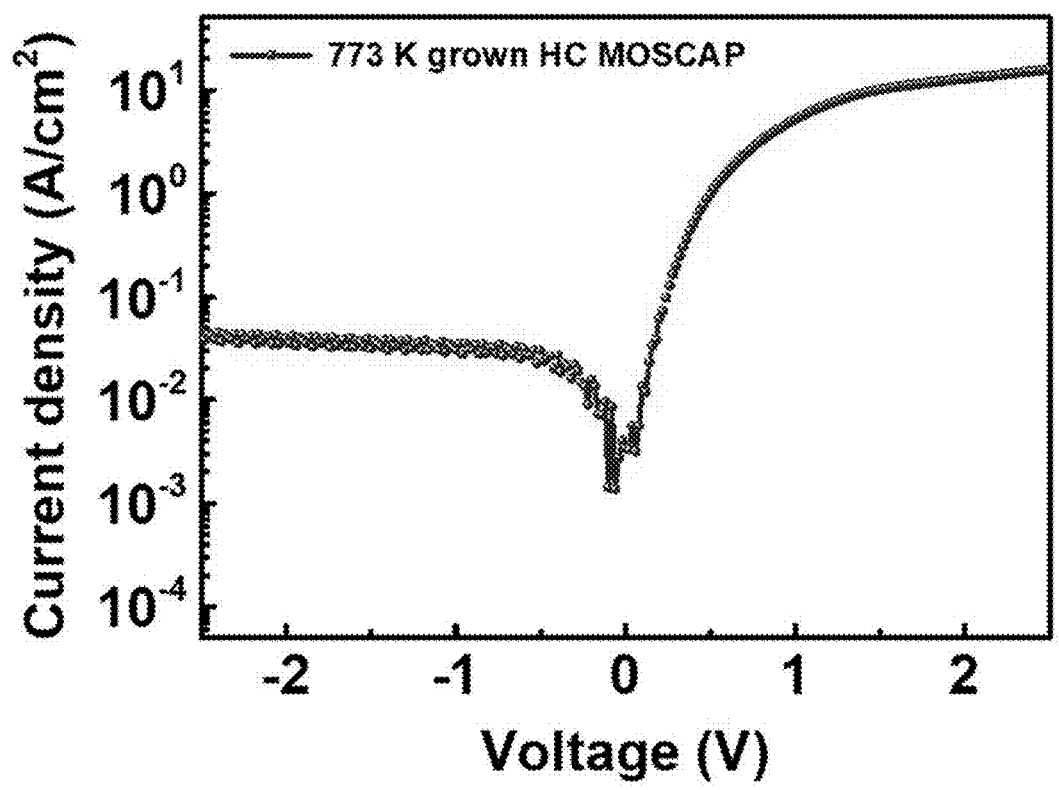
FIG. 7D is a view showing the two-terminal IV characteristic result of the hydrocarbon (HC) film according to Manufacturing Example 1 of the present invention.

FIG. 7A is a view showing the structure of a metal-insulator-semiconductor (MIS) element for measuring dielectric constant; FIG. 7B is a view showing an optical microscope photograph of the MIS element; FIG. 7C is a view showing Capacitance-voltage (C-V); and FIG. 7D is a view showing a two-terminal IV characteristic result of the hydrocarbon (HC) film according to Manufacturing Example 1 of the present invention.

Referring to FIG. 7, the hydrocarbon (HC) protective film according to Manufacturing Example 1 of the present invention is a dielectric film, and gate-dependent capacitance is measured using a metal-dielectric-semiconductor (MIS) device. A gate bias is applied to the back side of an N-type Si substrate, and a gold (Au) electrode having a thickness of 0.2 μm and a diameter of 100 μm is deposited on the HC dielectric layer. A maximum capacitance of about 3.0 nF can be confirmed at the n-branch. As the HC dielectric film shows a small hysteresis loss (lower than 10 mV) and a sharp transition between cumulative modulation and depletion, a very low trapped charge density is shown. The permittivity of the hydrocarbon (HC) film according to Manufacturing Example 1 of the present invention (grown at a temperature of 737 K) is about 26, and the maximum capacitance $C_{max}$ is calculated according to Equation 1.

$$C_{max} = \varepsilon_{HC}/t_{HC} \qquad \text{[Equation 1]}$$

Here, $\varepsilon HC$ denotes permittivity of the hydrocarbon (HC), $t_{HC}$ denotes thickness of the hydrocarbon (HC) film, and thickness of the hydrocarbon (HC) film is about 2.4 nm, and therefore, thickness of equivalent oxide is about 0.2 nm. The leakage current of the Au/HC/Si MIS capacitor is about 1 Acm$^{-2}$ at the applied voltage of 1 V. In addition, the HC dielectric film is maintained to be 2 V or higher corresponding to dielectric strength of at least 10 MVcm$^{-1}$.

Figure 3A:
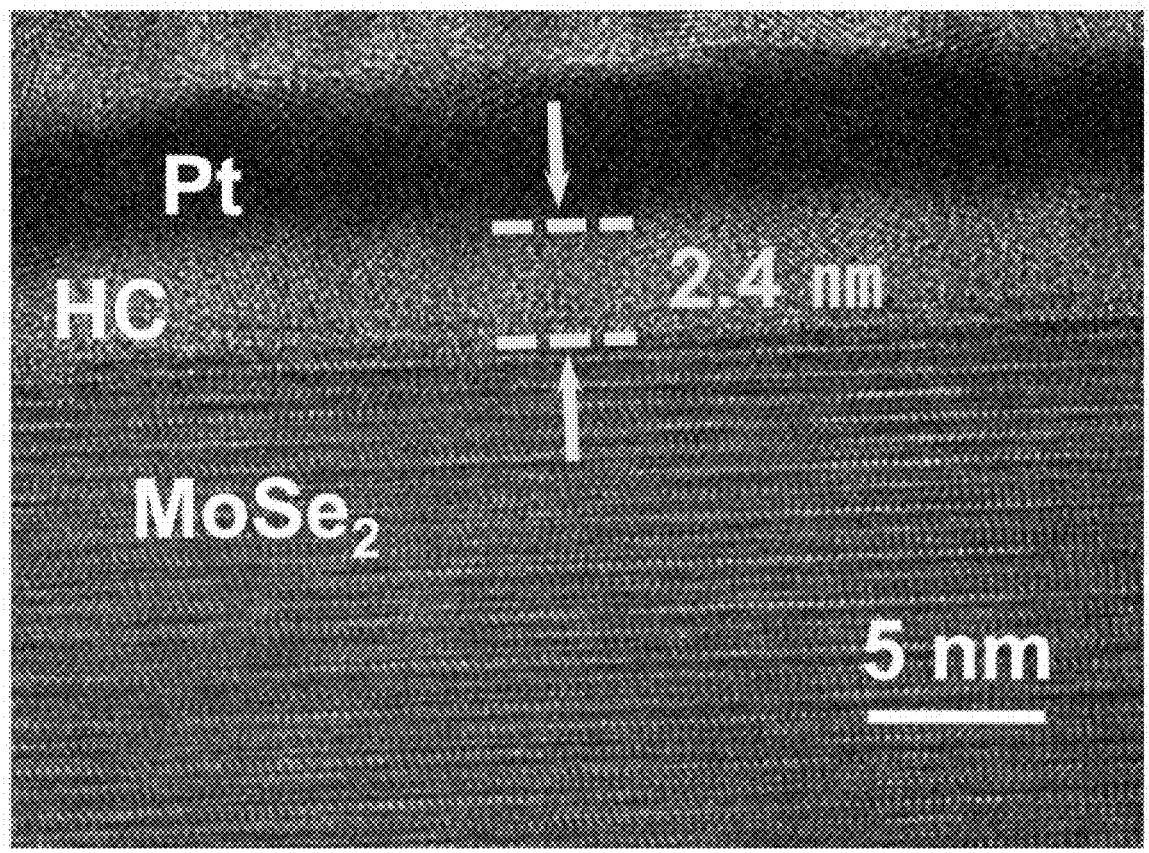
FIG. 3A is a view showing a scanning electron microscope image and FIG. 3B is a high-resolution transmission electron microscope image, photographing the cross-section of multilayer $MoSe_2$ capped with a hydrocarbon (HC) protective film according to Embodiment 1 of the present invention.
Figure 3B:
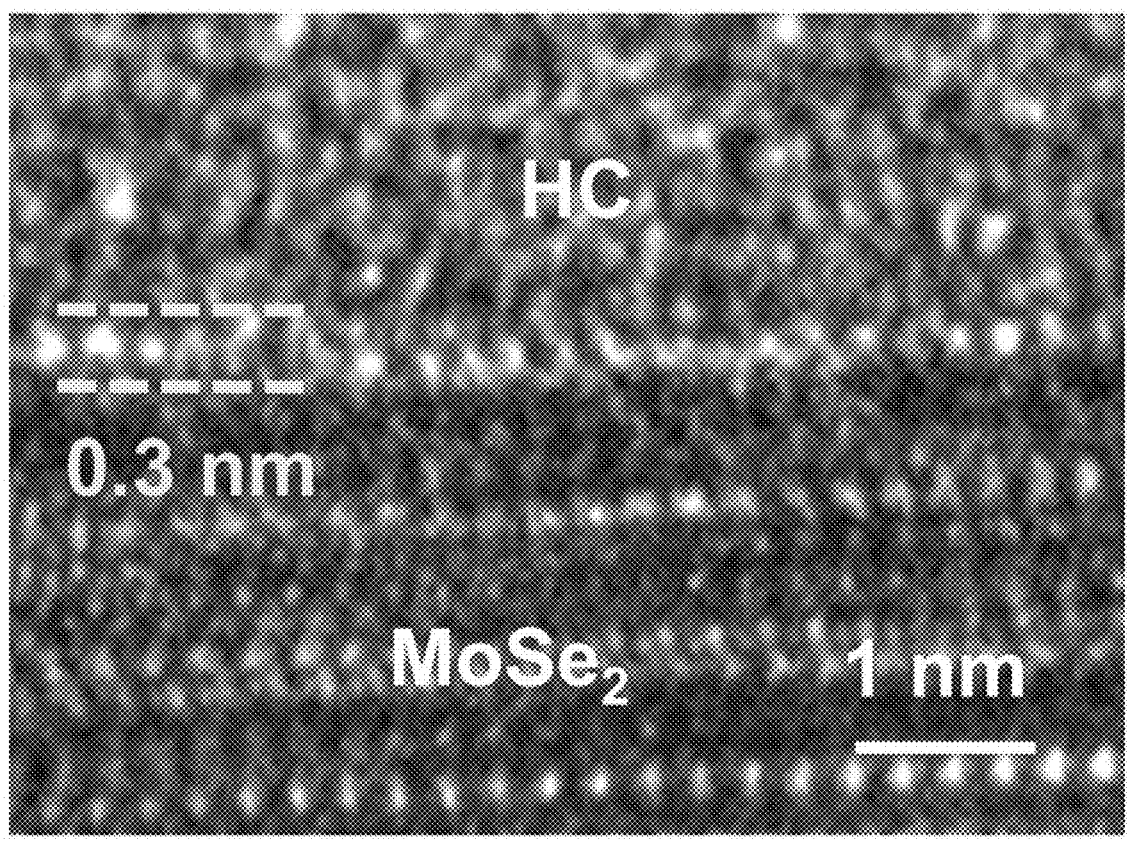
Figure 8:
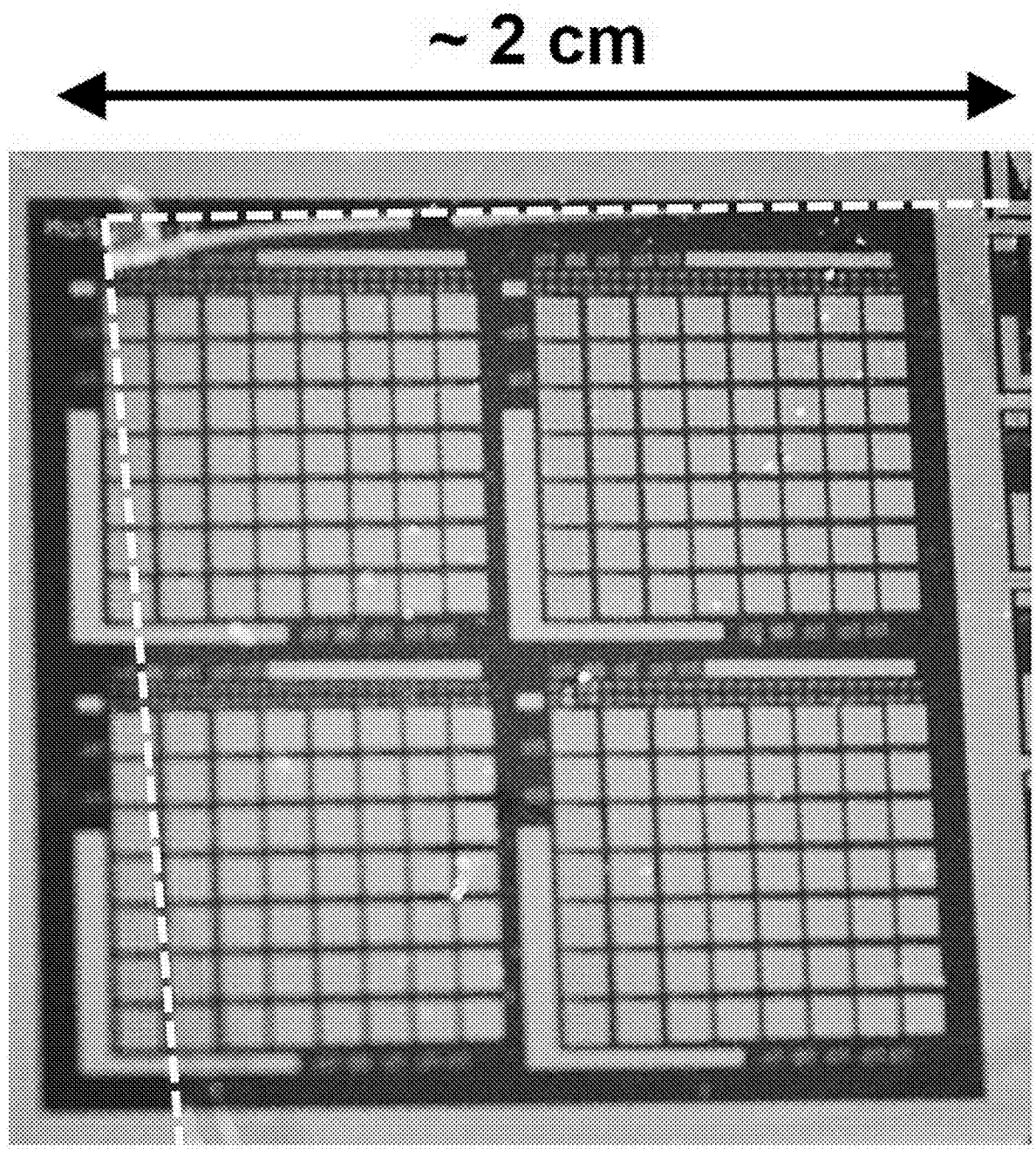
FIG. 8 is a view showing an optical photograph of a plurality of field effect transistors having multilayer $MoSe_2$ capped with a hydrocarbon (HC) protective film as a channel layer and formed on a 2×2 cm substrate according to Embodiment 1 of the present invention.

FIG. 3A is a view showing a scanning electron microscope image and FIG. 3B is a view showing a high-resolution transmission electron microscope image, photographing the cross-section of multilayer MoSe$_2$ capped with a hydrocarbon (HC) protective film according to Embodiment 1 of the present invention, and FIG. 8 is a view showing an optical photograph of a plurality of field effect transistors having multilayer MoSe$_2$ capped with a hydrocarbon (HC) protective film as a channel layer and formed on a 2×2 cm substrate according to Embodiment 1 of the present invention.

Referring to FIGS. 3 and 8, a hydrocarbon (HC) film (indicated by a white dotted line) having a size of 2×2 cm is transferred onto an MoSe$_2$ FET manufactured on the SiO$_2$/Si substrate. As a result of confirming the cross-section of the stacked HC/MoSe$_2$ FET through the picture, the channel layer is protected as an HC thin film with a thickness of approximately 2.4 nm uniformly and continuously covers the multilayer MoSe$_2$ without a noticeable pinhole or particle-shaped defect. At this point, it can be confirmed that the van der Waals gap is 0.3 nm (3 Å).

Experimental Example 2: Measure Electrical Characteristics of a Device

Figure 9A:
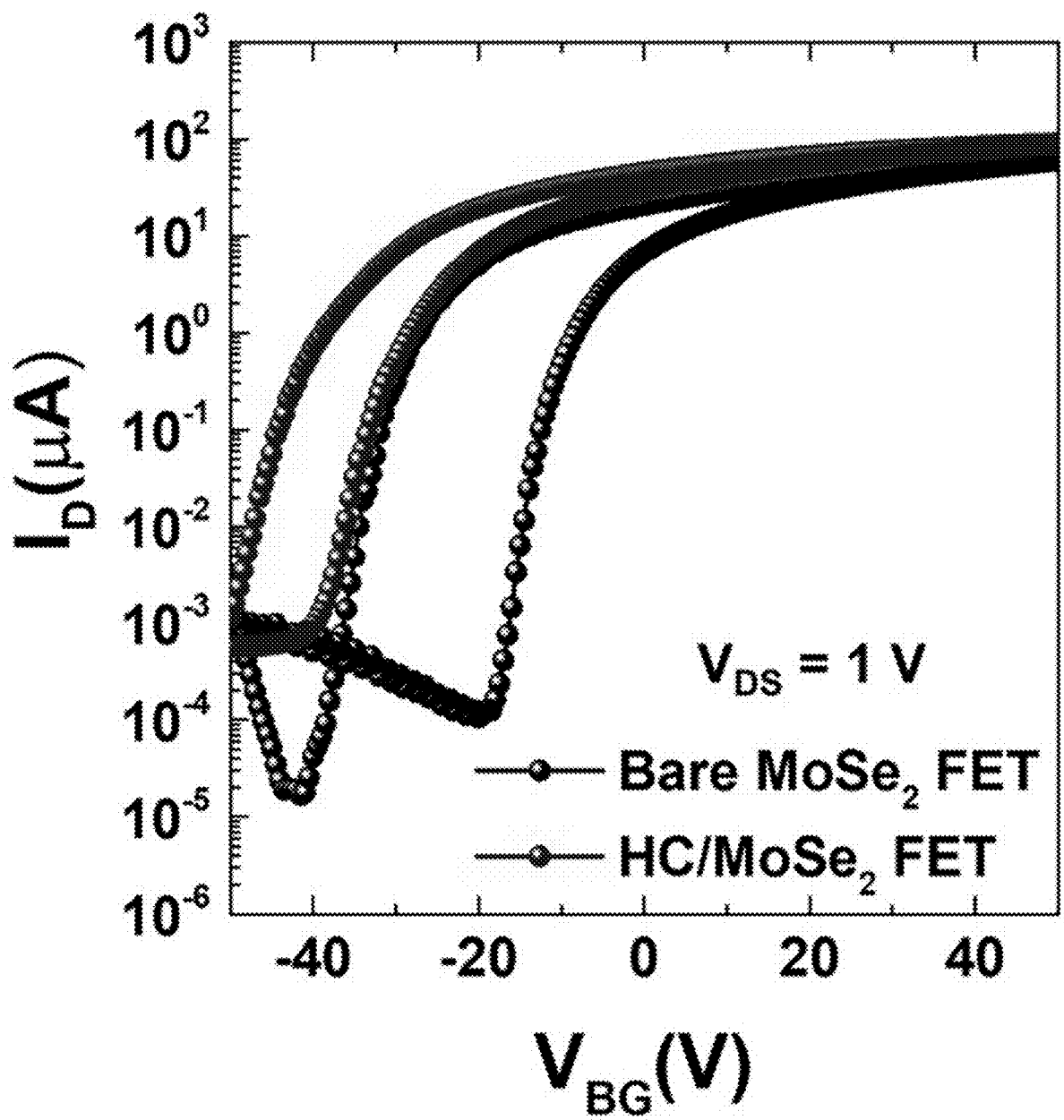
FIG. 9A is a view showing transfer characteristics according to presence or absence of an HC protective film.
Figure 9B:
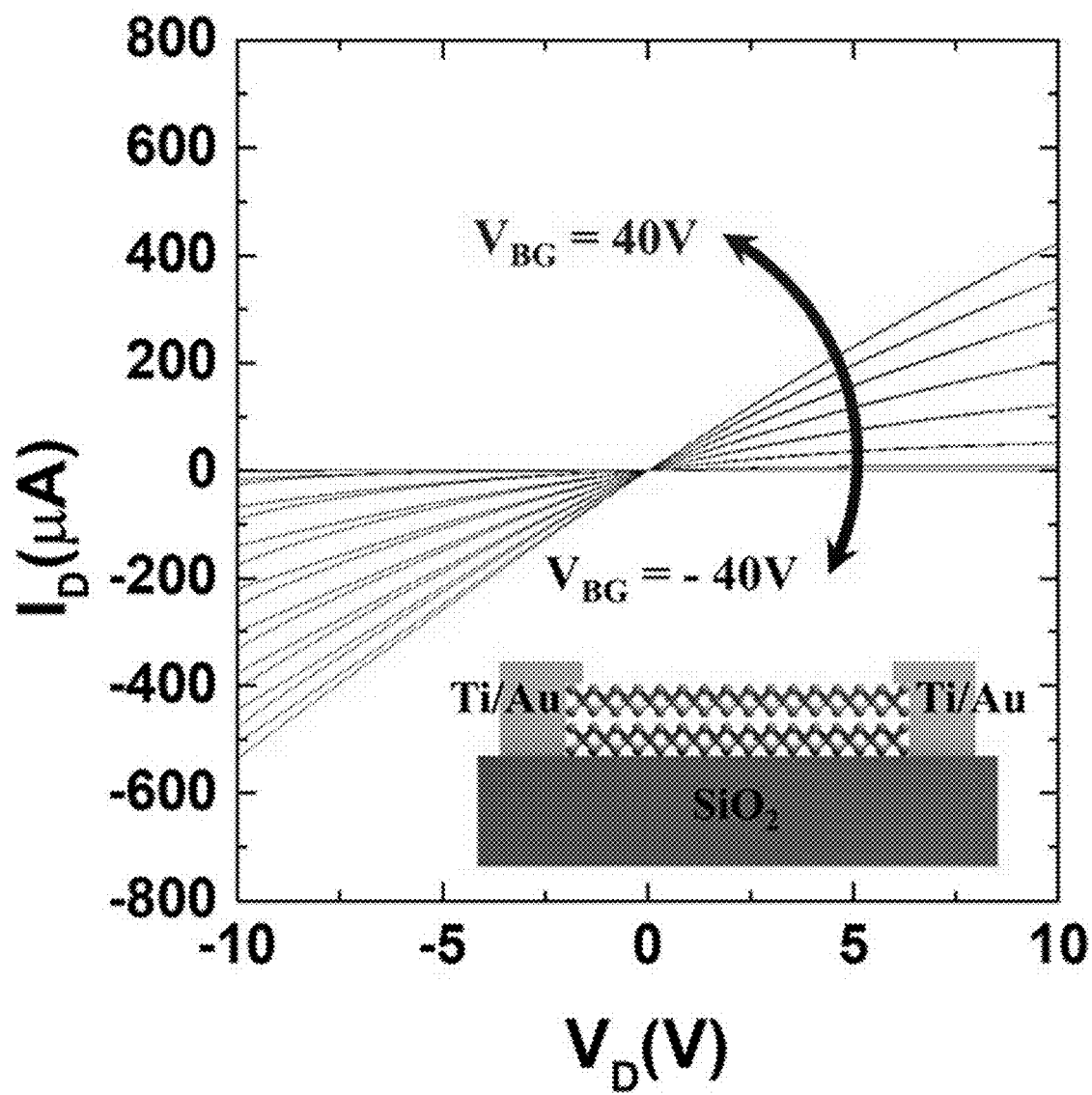
FIG. 9B is a view showing output characteristics of Comparative Example 1 without an HC protective film.
Figure 9C:
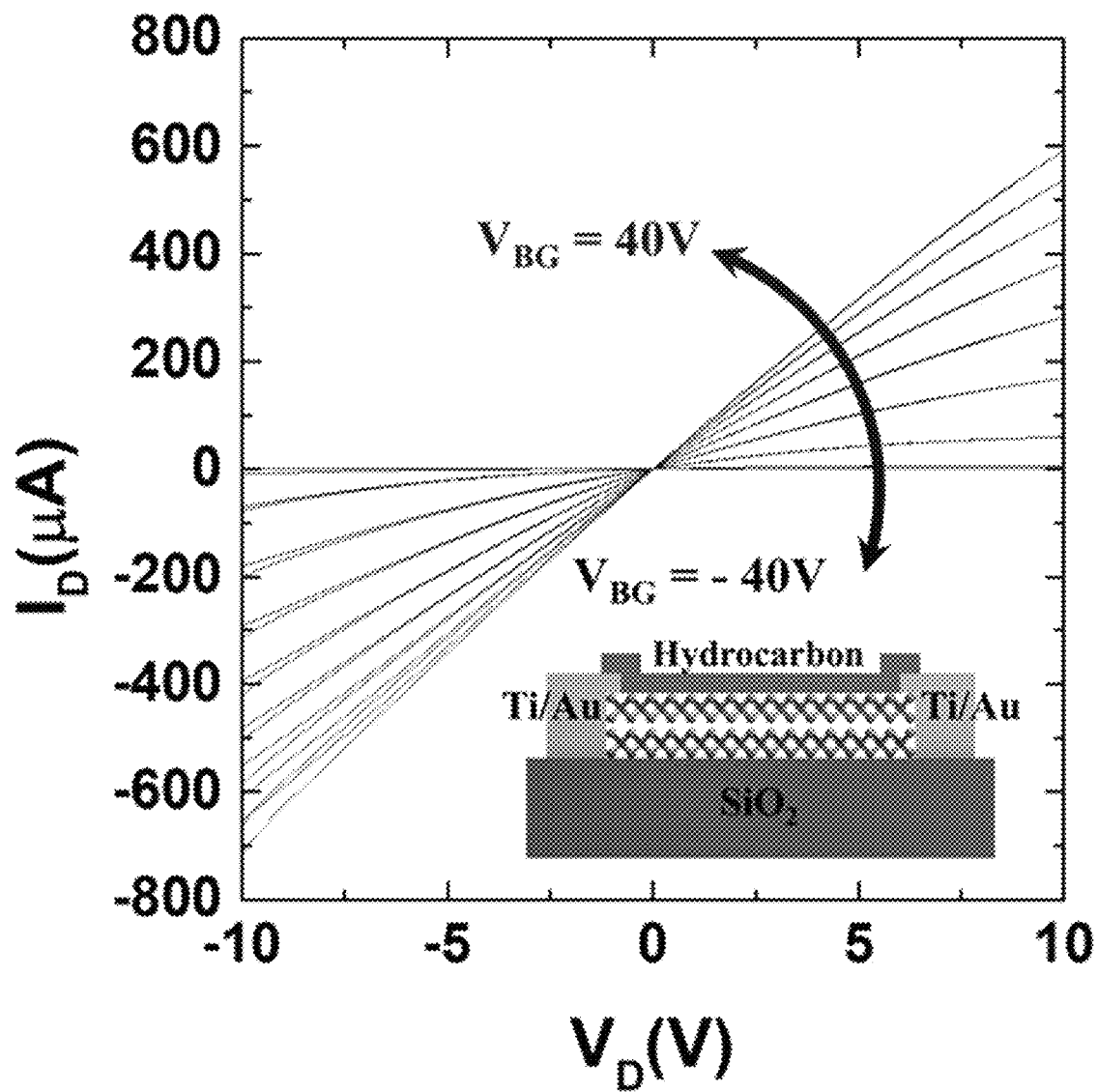
FIG. 9C is a view showing output characteristics of Embodiment 1 including an HC protective film.
Figure 9D:
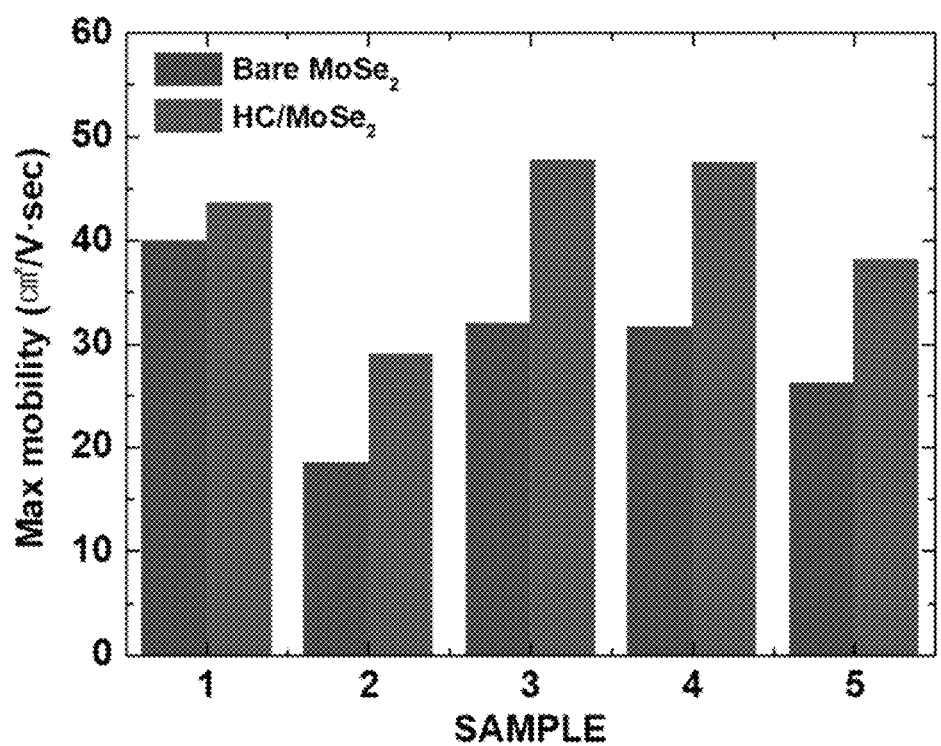
FIG. 9D is a view showing electron mobility statistics according to presence or absence of an HC protective film.
Figure 9E:
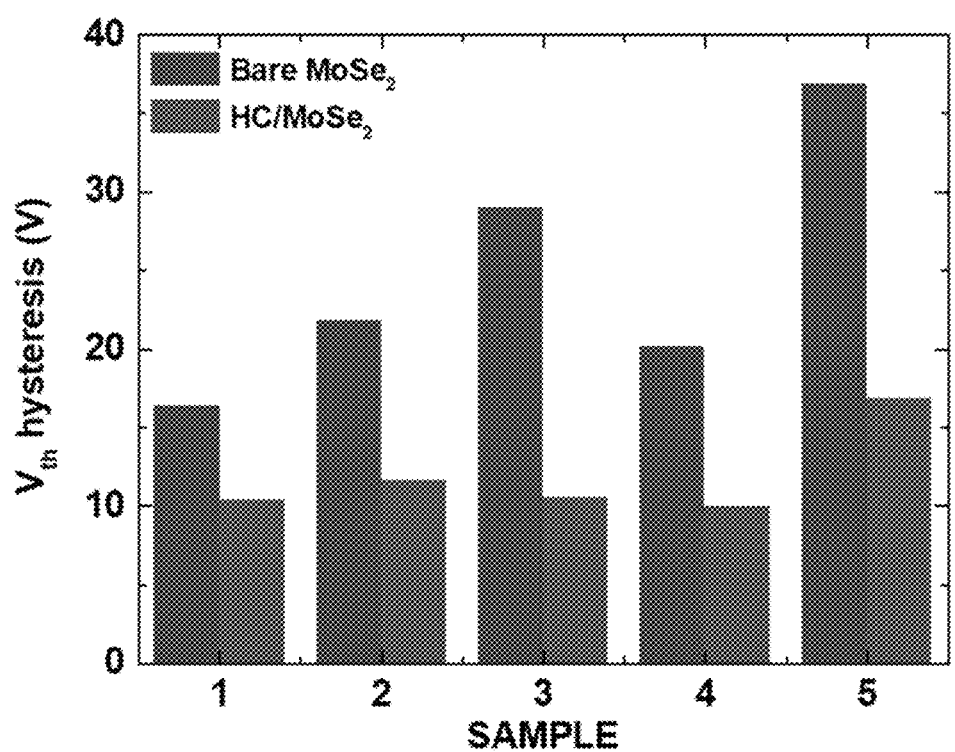
FIG. 9E is a view showing $V_{th}$ hysteresis statistics according to presence or absence of an HC protective film, for a field effect transistor having multilayer $MoSe_2$ capped with a hydrocarbon (HC) protective film as a channel layer according to Embodiment 1 and Comparative Example 1 of the present invention.

FIG. 9A is a view showing transfer characteristics according to presence or absence of an HC protective film; FIG. 9B is a view showing output characteristics of Comparative Example 1 without an HC protective film; FIG. 9C is a view showing output characteristics of Embodiment 1 including an HC protective film; FIG. 9D is a view showing an electron mobility statistics according to presence or absence of an HC protective film; and FIG. 9E is a view showing V$_{th}$ hysteresis statistics according to presence or absence of an HC protective film, for a field effect transistor having multilayer MoSe$_2$ capped with a hydrocarbon (HC) protective film as a channel layer according to Embodiment 1 and Comparative Example 1 of the present invention.

Referring to FIG. 9A to FIG. 9E, the transfer characteristics of applying a source-drain voltage of V$_{DS}$=1 V shows a general n-type behavior when a hydrocarbon (HC) protective film is not provided (marked in black color). On the other hand, when a protective layer is provided (marked in blue color), a semi-log scaled transfer characteristic is shown, and ION current increases from about 60 to 90 µA at the n-branch, whereas IOFF current of the p-branch is almost constant. In addition, the field effect electron mobility $\mu_{FE-e}$ is obtained as shown in Equation 2.

$$\mu_{FE-e} = \left(\frac{\delta I_{DS}}{\delta V_{BG|max}}\right)\left(\frac{L}{W}\right)\left(\frac{1}{C_{OX}}\right)\left(\frac{1}{V_{DS}}\right) \quad \text{[Equation 2]}$$

Here, $\delta V_{DS}/\delta V_{BG|max}$ denotes the maximum back-gated transconductance, L and W denote the length and width of the channel, Cox denotes the geometric back-gate capacitance, and V$_{DS}$ denotes the drain-source voltage. As the field effect electron mobility $\mu_{FE-e}$ of MoSe$_2$ without a protective film is calculated as about 29.61 cm$^2$V$^{-1}$s$^{-1}$, whereas the field effect electron mobility $\mu_{FE-e}$ after transferring the hydrocarbon (HC) protective film is calculated as about 41.18 cm$^2$V$^{-1}$s$^{-1}$, it can be confirmed that the field effect electron mobility is enhanced by about 40% as the protective film is included.

In addition, driving performance is further improved as the hysteresis between the forward and reverse bias sweepings, as well as the improved carrier transport behavior at the HC/MoSe$_2$ van der Waals junction, is greatly reduced. In order to extract a quantified value of hysteresis loss, a threshold voltage V$_{th}$ of the forward and reverse bias sweeping curves is extracted at a linear scale according to extrapolation using the linear region method (ELR). The ELR is obtaining a gate voltage axis intercept (I$_D$=0) of linear extrapolation of the I$_D$-V$_g$ graph at the first maximum slope (the maximum conduction point, gm). Therefore, when there is an HC capping layer on the MoSe$_2$ FET, hysteresis is reduced from 25 V to 12 V due to formation of a van der Waals interface. Shift of V$_{th}$ from about 4 to 10 V in the negative direction indicates slight n-doping. The forward sweep (from negative to positive) induces additional shift of threshold voltage V$_{th-FW}$ in the direction of negative bias, and this indicates electron trapping in the MoSe$_2$ channel. On the contrary, the backward sweep (from positive to negative) includes additional shift of threshold voltage toward positive bias, and this indicates de-trapping of the trapped electrons. Hysteresis of the transition metal dichalcogenide FET may be changed by the range of gate bias sweep, quality of the transition metal dichalcogenide/hydrocarbon (HC) interface, and thickness of the gate dielectric.

Improvement in the electrical driving performance can be confirmed by the output characteristics measured at a sweep speed of 1.6 Vs$^{-1}$. As shown in FIG. 9B, I$_D$ of the MoSe$_2$ FET without a protective film (Comparative Example 1) is in an almost linear relation with V$_{DS}$. The output performance of the MoSe$_2$ FET provided with a hydrocarbon (HC) protective film (Embodiment 1) in FIG. 9C is almost close to the Ohmic operation, and it is improved while maintaining the linear relation between I$_D$ and V$_{DS}$. In the case where V$_{BG}$=40 V, the output current ION at 10 V$_{DS}$ increases from 422 to 592 pA, and the output current ION at −10 V$_{DS}$ is improved from 536 to 718 µA. On the contrary, when a hydrocarbon (HC) protective film of low-temperature growth (473 K) is used, loss of hysteresis significantly increases. Therefore, the HC/MoSe$_2$ FET having a van der Waals interface according to the present invention may reduce hysteresis and improve electron mobility of the device by passivating (protecting) the channel surface and effectively blocking adsorption of molecules on the MoSe$_2$ surface. Since the van der Waals gap (about 0.3 nm) exists at the interface of the HC protective film and MoSe$_2$, occurrence of atomic disorder and interface defects can be suppressed fundamentally.

Referring to FIGS. 9D and 9E, as a result of performing reproducibility analysis on five identical devices, the MoSe$_2$ FET provided with a hydrocarbon (HC) protective film (Embodiment 1, denoted as HC/MoSe$_2$) increases electron mobility by about 9 to 57% compared to a general MoSe$_2$ FET without a protective film (Comparative Example 1, denoted as Bare MoSe$_2$). In addition, it is confirmed that reproducibility with respect to hysteresis reduction is in a range of about 10 to 17 V$_{th}$ in the case of Embodiment 1, whereas hysteresis of Comparative Example 1 is distributed in a range of about 16 to 37 V$_{th}$.

Figure 10A:
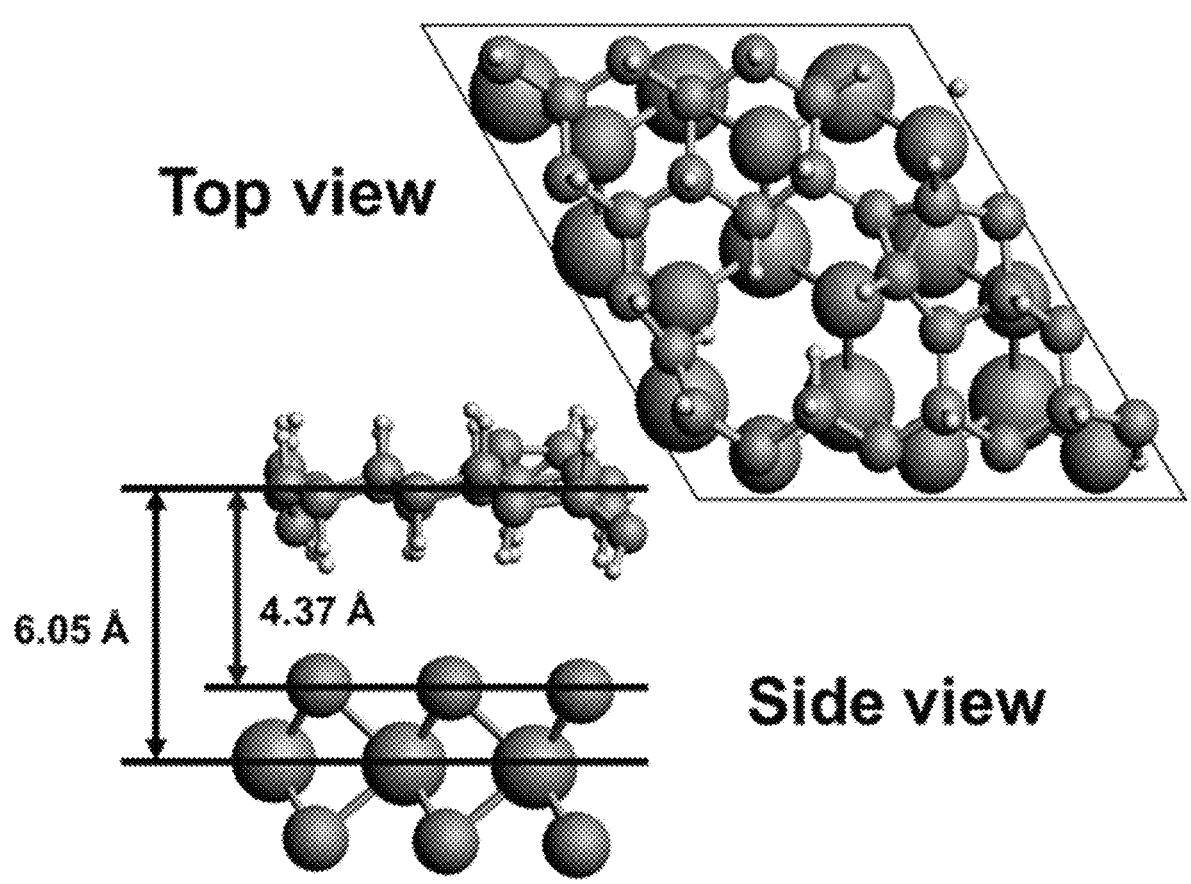
FIG. 10A is a view showing a mimetic view of a stacked $HC/MoSe_2$ structure.
Figure 10B:
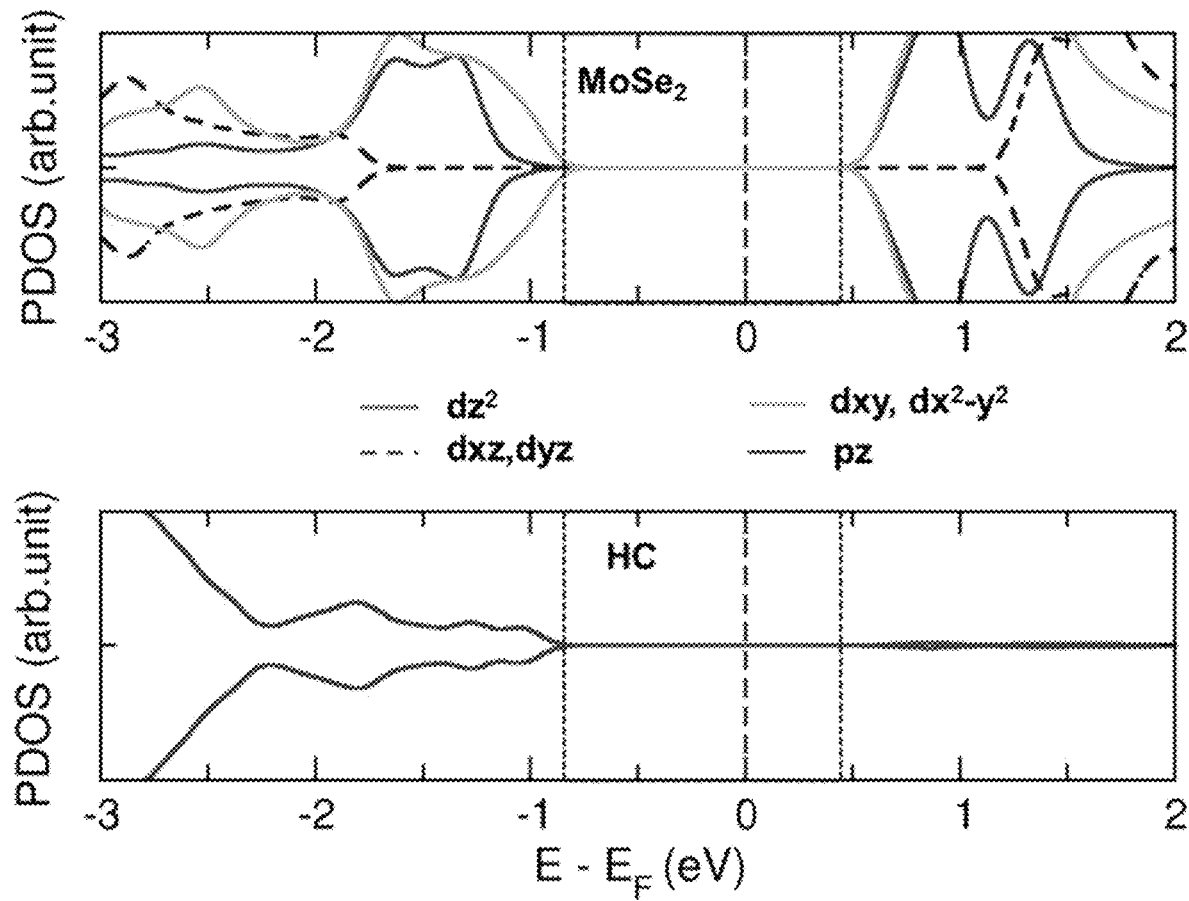
FIG. 10B is a view showing a projected density of states (PDOS) of $MoSe_2$ (top) and HC (bottom)
Figure 10C:
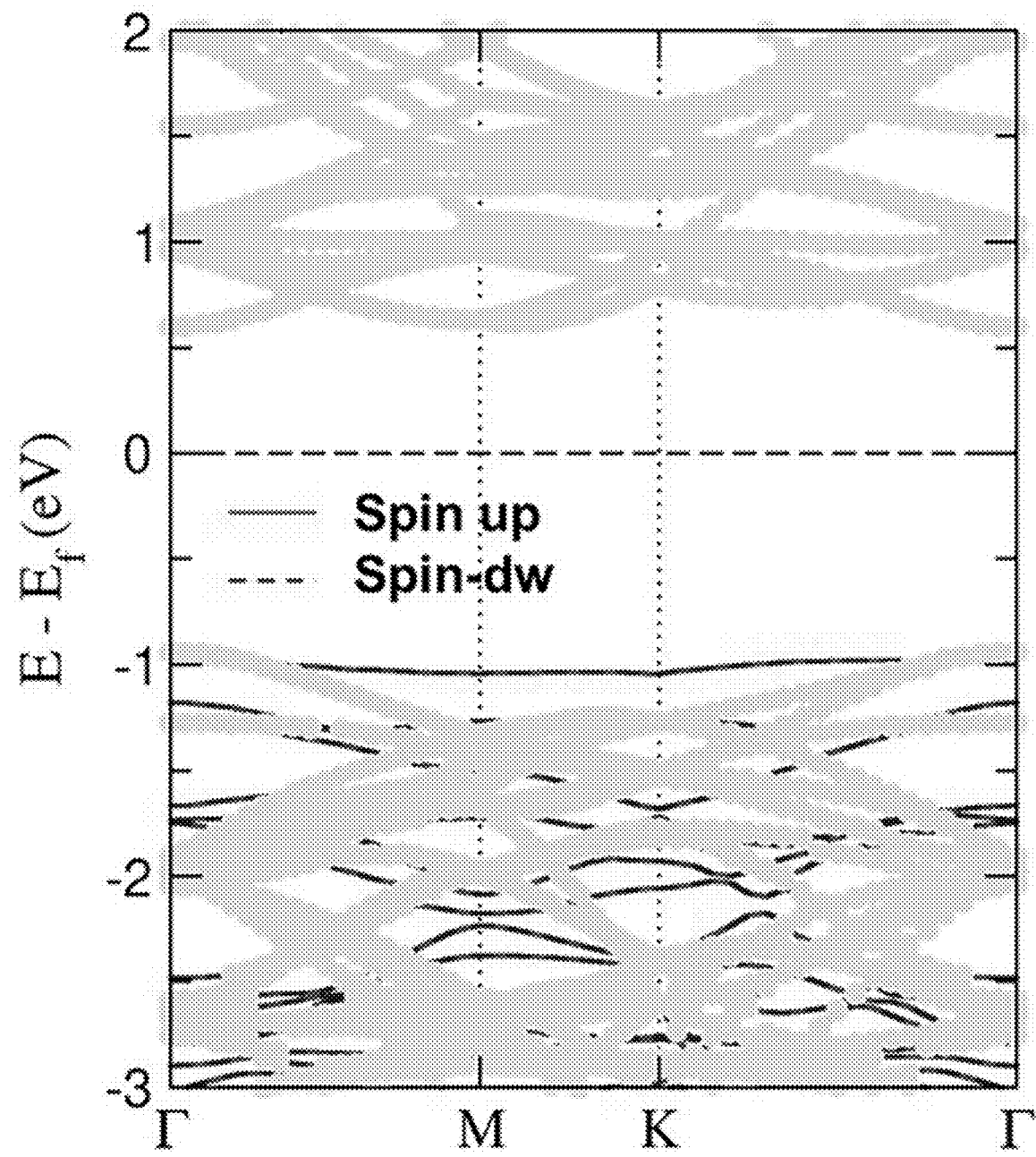
FIG. 10C is a view showing a result of band structure calculation.
Figure 10D:
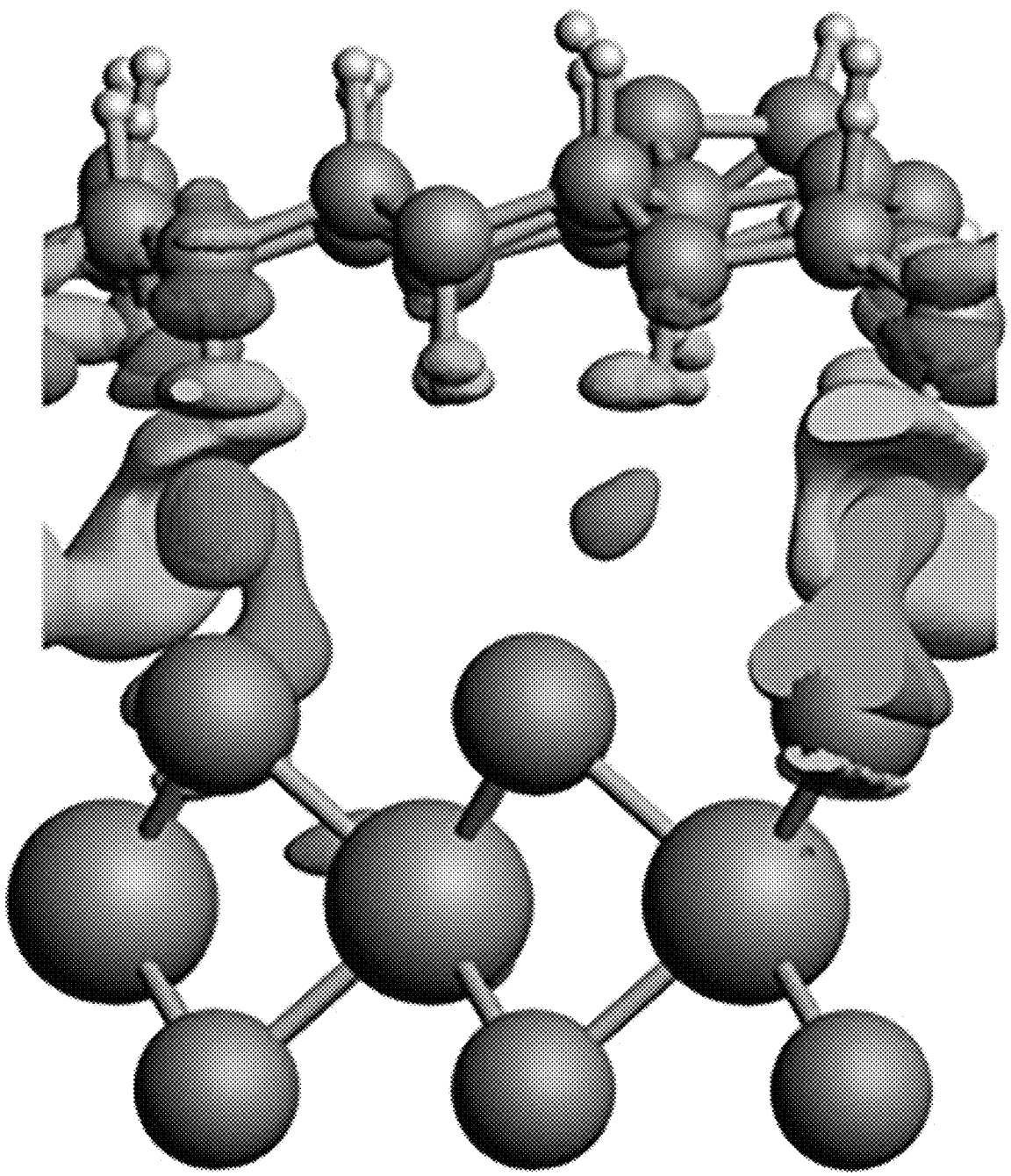
FIG. 10D is a view showing differential charge density (red: electron accumulation, green: electron depletion)
Figure 10E:
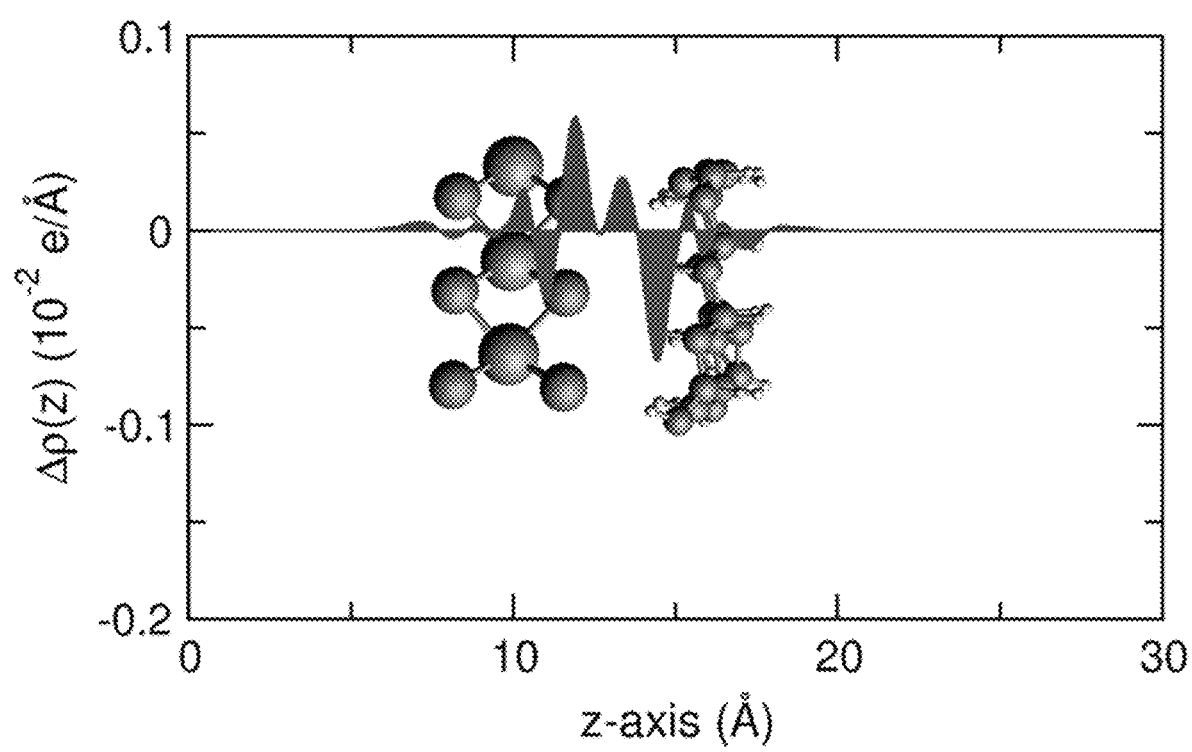
FIG. 10E is a view showing a difference in planar average charge density (positive value: electron accumulation, negative value: electron depletion)
Figure 10F:
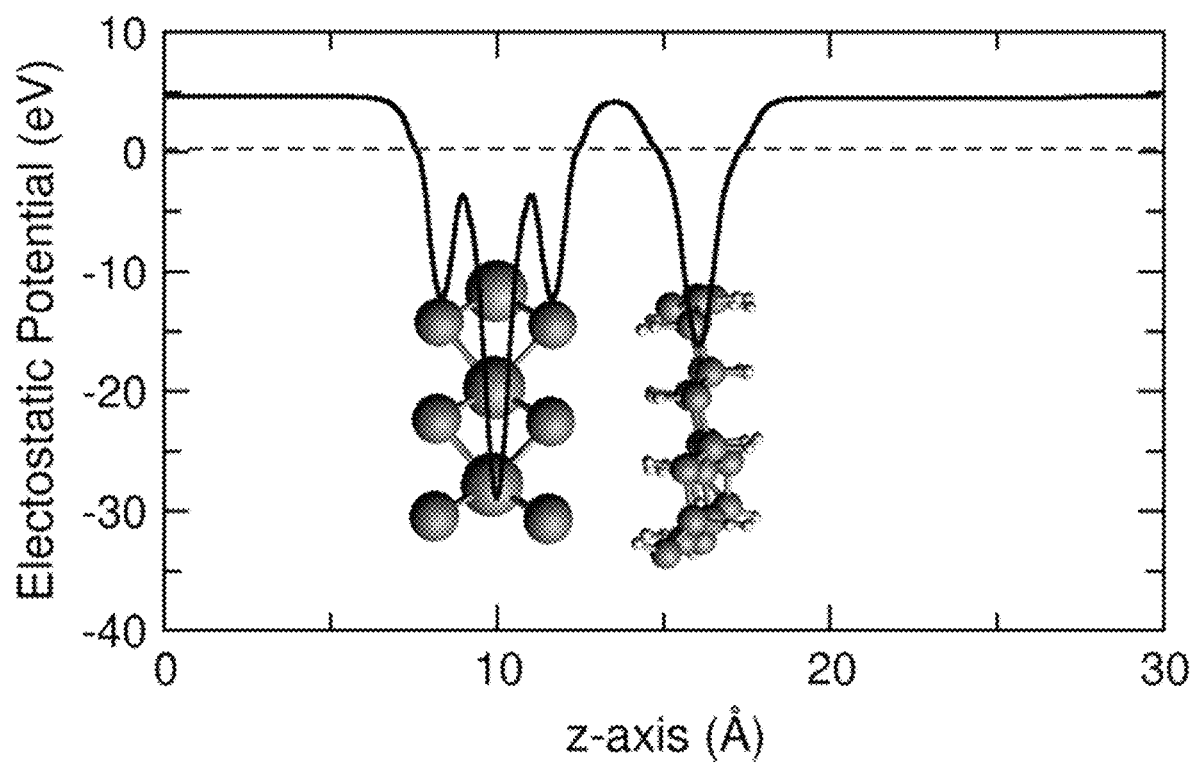
FIG. 10F is a view showing a result of electrostatic potential calculation, for a field effect transistor having multilayer $MoSe_2$ capped with a hydrocarbon (HC) protective film as a channel layer according to Embodiment 1 and Comparative Example 1 of the present invention.

FIG. 10A is a view showing a mimetic view of a stacked HC/MoSe$_2$ structure; FIG. 10B is a view showing a projected density of states (PDOS) of MoSe$_2$ (top) and HC (bottom); FIG. 10C is a view showing a result of band structure calculation; FIG. 10D is a view showing differential charge density (red: electron accumulation, green: electron depletion); FIG. 10E is a view showing a difference in planar average charge density (positive value: electron accumulation, negative value: electron depletion); and FIG. 10F is a view showing a result of electrostatic potential calculation, for a field effect transistor having multilayer MoSe$_2$ capped with a hydrocarbon (HC) protective film as a channel layer according to Embodiment 1 and Comparative Example 1 of the present invention.

Referring to FIG. 10A to FIG. 10F, electrical influence of formation of a van der Waals gap through a hydrocarbon (HC) protective film on single layer MoSe$_2$ can be predicted by performing a density functional theory (DFT) calculation. In the present invention, 3×3 and 4×4 supercells are used for the single layer MoSe$_2$ and the HC model, respectively. As shown in FIG. 10A, the atomic structure of amorphous hydrocarbon (HC) can be calculated by replacing C atoms with H atoms in the honeycomb lattice of the carbon network since it is almost impossible to estimate an accurate amorphous structure. The van der Waals gap between HC and MoSe$_2$ is calculated as 4.37 Å, and it can be confirmed that this is within a range similar to that of the TEM result shown in FIG. 3B described above. The range within the blue dotted box in FIG. 10B represents the range of MoSe$_2$ bandgap, and comparing the projected density of states (PDOS) of MoSe$_2$ (top) and HC (bottom), it can be confirmed that there is no observable electronic state within the range of MoSe$_2$ bandgap, and through FIG. 10C, it is known that the band structure of MoSe$_2$ with a hydrocarbon (HC) protective film (Embodiment 1) is almost the same as that of MoSe$_2$ without a protective film (Comparative Example 1).

In addition, FIG. 10D shows a result of charge density difference of HC/MoSe$_2$ structure. The red color corresponds to charge accumulation, whereas the green color corresponds to charge depletion. It induces charge redistribution near the van der Waals interface region due to stacking of hydrocarbons (HC) on the surface of MoSe$_2$, and shows differential charge density. On the contrary, FIG. 10E shows that only a small charge concentration of MoSe$_2$ moves toward the van der Waals gap. FIG. 10F shows that the van der Waals gap between HC and MoSe$_2$ has a height φ of 3.93 eV derived from calculation of electrostatic potential, and it corresponds to the built-in interface potential.

Figure 11A:
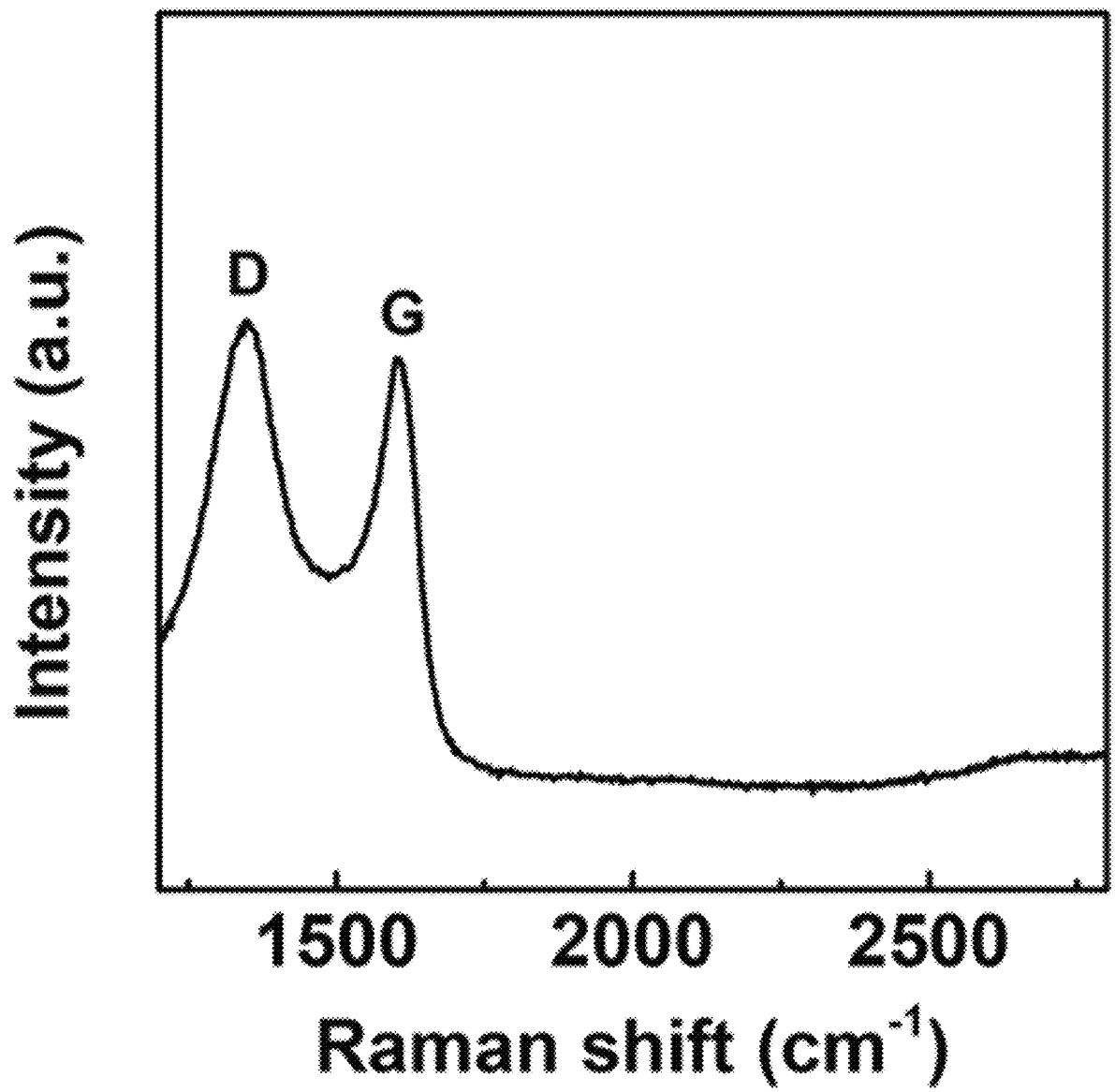
FIG. 11A is a view showing a result of Raman spectroscopy after 3 months of storage.
Figure 11B:
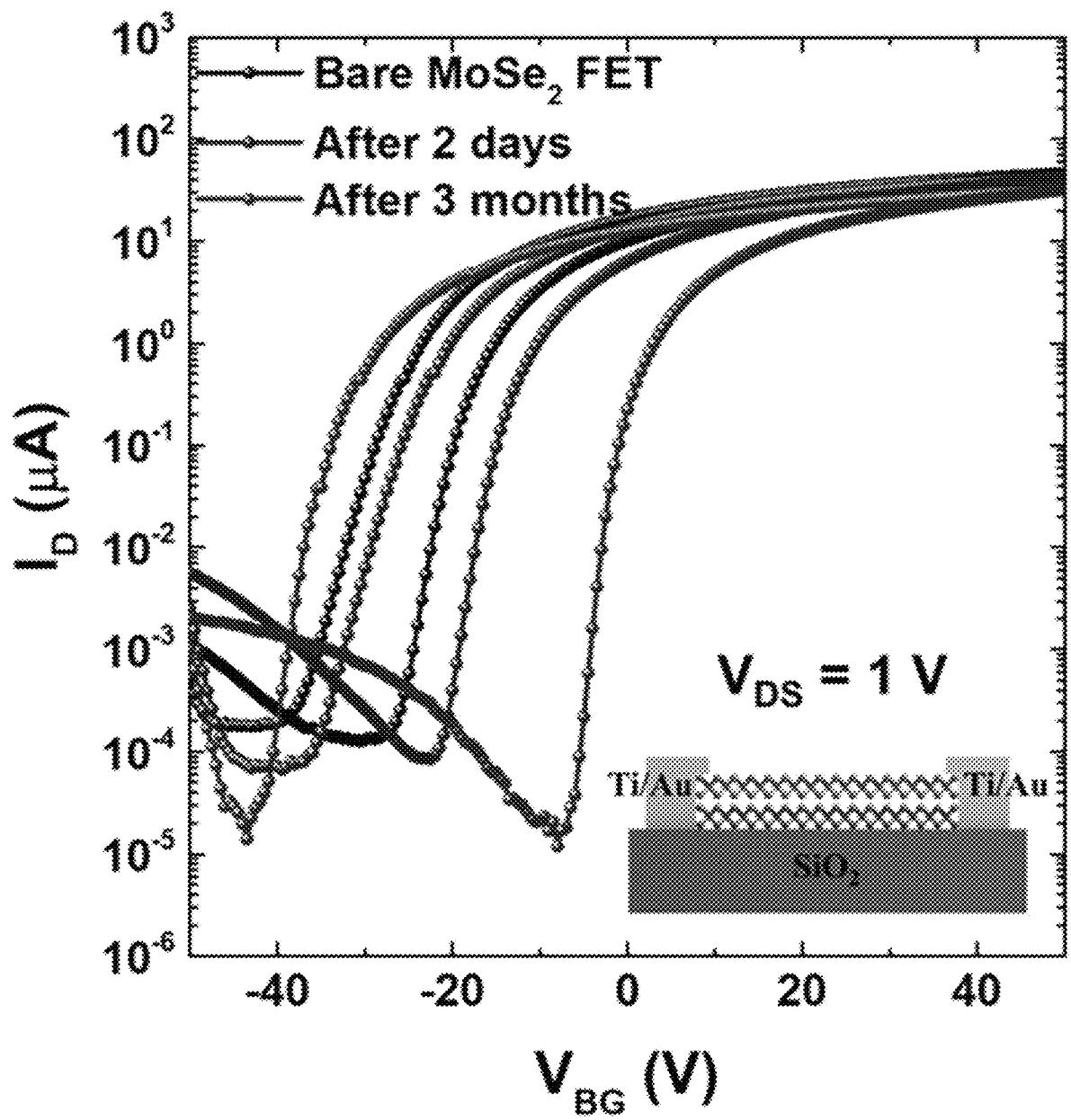
FIG. 11B is a view showing output characteristics of Comparative Example 1 without an HC protective film.
Figure 11C:
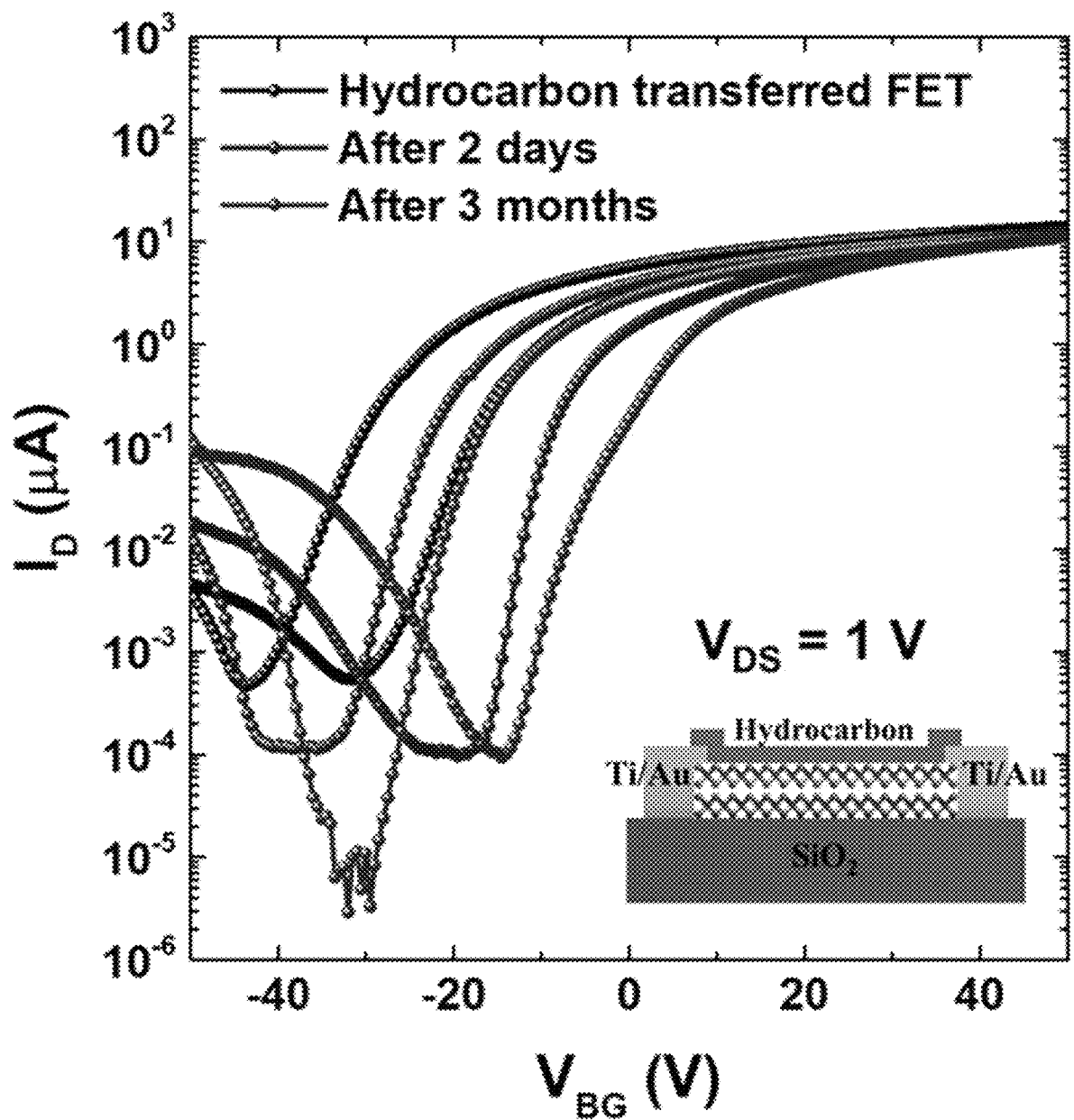
FIG. 11C is a view showing output characteristics of Embodiment 1 including an HC protective film according to the period of storage.
Figure 11D:
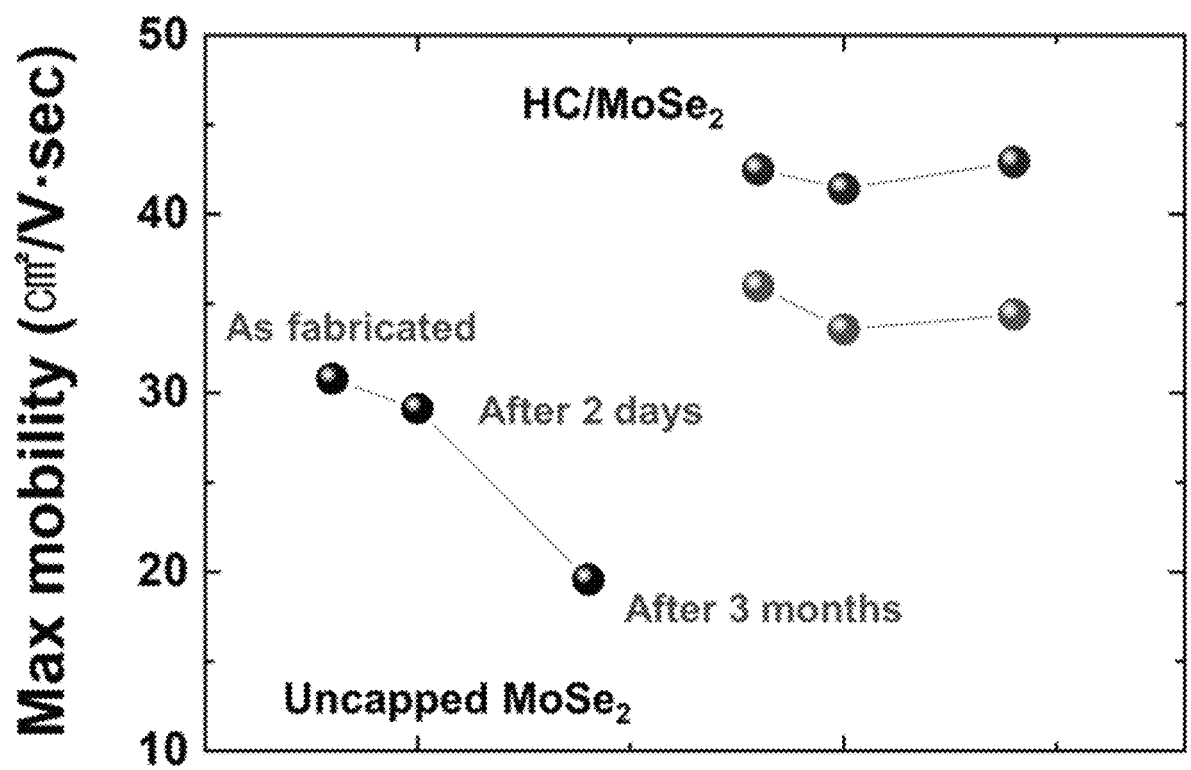
FIG. 11D is a view showing a result of electron mobility statistics according to presence or absence of a protective film.
Figure 11E:
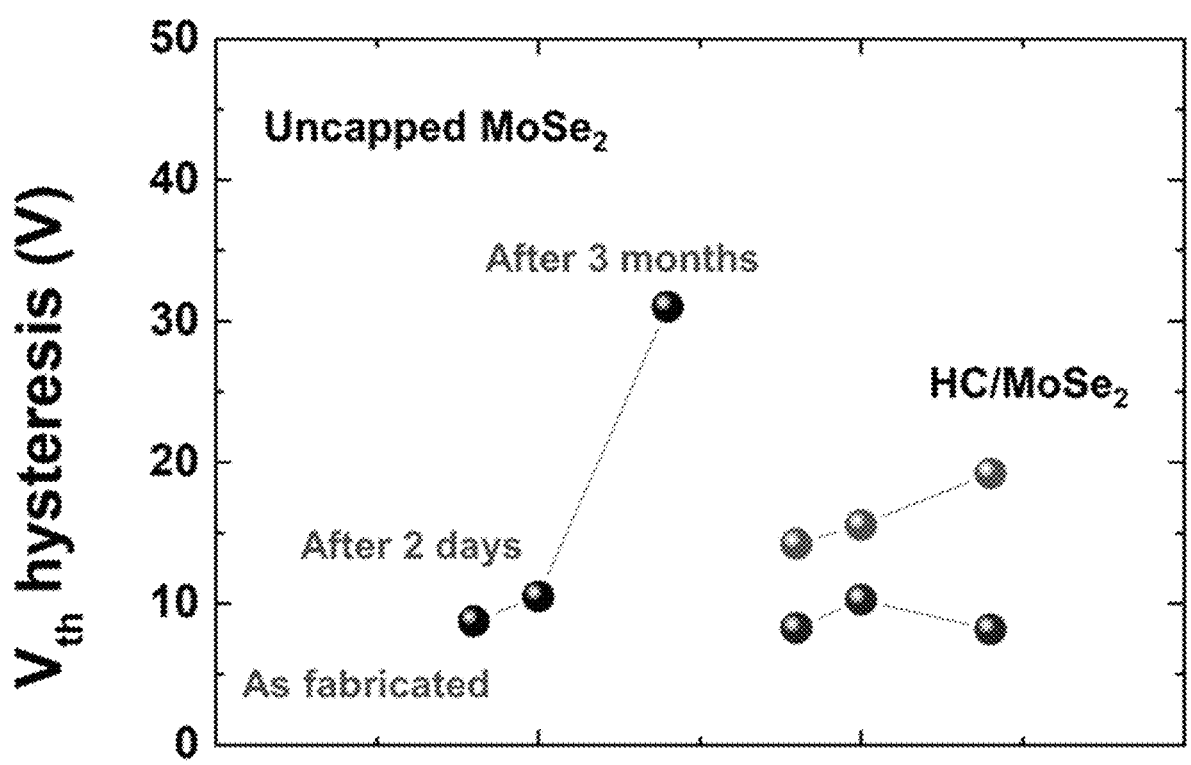
FIG. 11E is a view showing a result of $V_{th}$ hysteresis statistics according to presence or absence of an HC protective film according to the period of storage, for a field effect transistor having multilayer $MoSe_2$ capped with a hydrocarbon (HC) protective film as a channel layer according to Manufacturing Example 1, Embodiment 1, and Comparative Example 1 of the present invention.

FIG. 11A is a view showing a result of Raman spectroscopy after 3 months of storage; FIG. 11B is a view showing output characteristics of Comparative Example 1 without an HC protective film; FIG. 11C is a view showing output characteristics of Embodiment 1 including an HC protective film according to the period of storage; FIG. 11D is a view showing a result of electron mobility statistics according to presence or absence of a protective film; and FIG. 11E is a view showing a result of $V_{th}$ hysteresis statistics according to presence or absence of an HC protective film according to the period of storage, for a field effect transistor having multilayer MoSe$_2$ capped with a hydrocarbon (HC) protective film as a channel layer according to Manufacturing Example 1, Embodiment 1, and Comparative Example 1 of the present invention.

Referring to FIG. 11A to FIG. 11E, after the initial measurement performed on a field effect transistor having multilayer MoSe$_2$ capped with a hydrocarbon (HC) protective film of the present invention as a channel layer, electrical characteristics of the device are measured after 2 days and 3 months in the air of room temperature to confirm stability of the hydrocarbon (HC) protective film. First, FIG. 11A shows a result of Raman spectroscopy on the hydrocarbon (HC) protective film of Manufacturing Example 1, and it can be confirmed that although 3 months are passed after the initial measurement, the D band and G band are still observed, and the chemical structure of the protective film is maintained.

FIG. 11B shows the field effect electron mobility of 31 cm$^2$V$^{-1}$s$^{-1}$ and hysteresis of about 9 $V_{th}$ of an MoSe$_2$ FET without a protective film when 3 months are passed after the initial measurement. After 2 days, the transfer curve of MoSe$_2$ exposed to the air without a protective film has been shifted to the positive bias, and the hysteresis is slightly increased, and the mobility is decreased. In addition, when it is additionally exposed to surrounding conditions for 3 months without a protective film, the electrical performance is significantly lowered while the hysteresis is increased to 31 $V_{th}$. Moreover, mobility of MoSe$_2$ is decreased to 20 cm$^2$V$^{-1}$s$^{-1}$. Due to adsorption of surrounding molecules on the surface of MoSe$_2$, carriers are trapped by the adsorbed molecules. As the coverage of the molecules adsorbed on the surface of MoSe$_2$ increases, the carrier trapping/detrapping process at the air/MoSe$_2$ interface becomes prominent, and the hysteresis increases significantly. Furthermore, as defect of MoSe$_2$ or oxidation of edge portions is induced by air exposure without a protective film, degradation in electrical performance of the FET device can be generated.

Meanwhile, although it is confirmed that the environmental stability is improved when it is measured first for the MoSe$_2$ FET with a hydrocarbon (HC) protective film formed thereon (denoted as Hydrocarbon Transferred FET) and shows a field effect electron mobility of 36 cm$^2$V$^{-1}$s$^{-1}$ and a hysteresis of about 14 $V_{th}$, after 3 months, they are measured to be 34 cm$^2$V$^{-1}$s$^{-1}$ and about 19 $V_{th}$, confirming that there is no significant changes in the electrical characteristics in comparison with the initial measurement. That is, electron mobility of the field effect transistor is changed from 36 cm$^2$V$^{-1}$s$^{-1}$ before exposure to the external environment to 34 cm$^2$V$^{-1}$s$^{-1}$ after 3 months of exposure, and it can be confirmed that a reduction rate of about 5.5% is shown. In addition, referring to FIGS. 11D and 11E, when confirming reproducibility between the same field effect transistors, it can be confirmed that the passivation effect on the channel layer of the field effect transistor is shown to be similar to those described above through the hydrocarbon (HC) protective film.

According to the present invention as described above, as a field effect transistor (FET) having a transition metal dichalcogenide capped with a hydrocarbon (HC) protective film according to a preferred embodiment of the present invention as a channel layer forms a dielectric thin film having a large area of a centimeter scale as a protective film on the surface of the transition metal dichalcogenide, the problem of lowering electrical performance of the field effect transistor, which is generated due to scattering or trapping of carriers within the channel as impurity molecules such as oxygen, moisture, and the like existing in the surrounding environment are adsorbed on the surface of the transition metal dichalcogenide and act as defects, can be solved, and stability of long-term storage can be improved.

The effects of the present invention are not limited to those mentioned above, and also include other effects that are not explicitly mentioned but can be clearly understood by those skilled in the art from the description throughout the specification.

Although the embodiments of the present invention have been described with reference to the accompanying drawings, those skilled in the art will understand that the present invention can be implemented in other specific forms without changing the technical spirit or essential features thereof. Therefore, it should be understood that the embodiments described above are exemplary and not restrictive in all respects.

DESCRIPTION OF SYMBOLS

100: Field effect transistor
110: Substrate
111: Silicon
112: Dielectric layer
120: Channel layer
130: Electrode
140: Protective film

What is claimed is:
1. A field effect transistor comprising:
a channel layer provided on a substrate and including a transition metal dichalcogenide thin film;
a plurality of electrodes arranged on a portion of the channel layer to be spaced apart from each other; and
a protective film for covering the channel layer or the channel layer and the electrodes, forming a van der

Waals gap by being in contact with the transition metal dichalcogenide thin film, and containing hydrocarbon, wherein the protective film maintains electrical performance of the field effect transistor even when the field effect transistor is exposed to an external environment, and maintaining electrical performance of the field effect transistor is measuring a reduction rate of electron mobility to be lower than 10% when contact with air and oxygen is continued for several months.

2. The field effect transistor according to claim 1, wherein the hydrocarbon is amorphous, and partially includes a crystalline carbon structure showing a 1,350 $cm^{-1}$ peak (D) and/or a 1,600 $cm^{-1}$ peak (G) in Raman spectroscopy.

3. The field effect transistor according to claim 1, wherein a dielectric constant of the protective film is 10 to 40.

4. The field effect transistor according to claim 1, wherein a thickness of the protective film is 0.1 to 5 nm.

5. The field effect transistor according to claim 1, wherein the van der Waals gap is 1 to 5 Å.

6. A method of manufacturing a field effect transistor, the method comprising the steps of:

growing a hydrocarbon thin film on a substrate (S01);

preparing a field effect transistor having a channel layer including a transition metal dichalcogenide thin film and a plurality of electrodes disposed to be spaced apart from each other on remaining portions of the channel layer (S02); and covering the transition metal dichalcogenide thin film and the electrodes by transferring the hydrocarbon film, and forming a van der Waals gap between the hydrocarbon film and the transition metal dichalcogenide thin film (S03).

7. The method according to claim 6, wherein the step of growing a hydrocarbon thin film includes low temperature CVD (LTCVD), inductively coupled plasma-CVD (ICP-CVD), low pressure CVD (LPCVD), atmospheric pressure CVD (APCVD), metal organic CVD (MOCVD), plasma-enhanced CVD (PECVD), or two or more methods selected therefrom.

8. The method according to claim 6, wherein a growth temperature at the step of growing a hydrocarbon thin film is in a range of 500 to 900 K.

9. The method according to claim 6, wherein a dielectric constant of the hydrocarbon thin film is 10 to 40.

10. The method according to claim 6, wherein the hydrocarbon is amorphous, and partially includes a crystalline carbon structure showing a 1,350 $cm^{-1}$ peak (D) and/or a 1,600 $cm^{-1}$ peak (G) in Raman spectroscopy.

11. The method according to claim 6, wherein a thickness of the hydrocarbon film is 0.1 to 5 nm.

12. The method according to claim 6, wherein the van der Waals gap is 1 to 5 Å.

13. The method according to claim 6, wherein the protective film maintains electrical performance of the field effect transistor even when the field effect transistor is exposed to an external environment, and maintaining electrical performance of the field effect transistor is measuring a reduction rate of electron mobility to be lower than 10% when contact with air and oxygen is continued for several months.

* * * * *